(12) United States Patent
Hyun et al.

(10) Patent No.: US 9,373,374 B2
(45) Date of Patent: Jun. 21, 2016

(54) SEMICONDUCTOR APPARATUS CAPABLE OF SELF-TUNING A TIMING MARGIN

(71) Applicant: SK hynix Inc., Icheon-si Gyeonggi-do (KR)

(72) Inventors: Sang Ah Hyun, Icheon-si (KR); Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/607,812

(22) Filed: Jan. 28, 2015

(65) Prior Publication Data

US 2016/0118094 A1 Apr. 28, 2016

(30) Foreign Application Priority Data

Oct. 24, 2014 (KR) .................. 10-2014-0145310

(51) Int. Cl.
*H03L 7/06* (2006.01)
*G11C 7/22* (2006.01)

(52) U.S. Cl.
CPC .................................... *G11C 7/22* (2013.01)

(58) Field of Classification Search
USPC .................................. 327/147–149, 156–158
See application file for complete search history.

(56) References Cited

U.S. PATENT DOCUMENTS

| 6,906,566 | B2* | 6/2005 | Drexler | H03L 7/087 327/158 |
|---|---|---|---|---|
| 7,064,591 | B1* | 6/2006 | Humphreys | H03L 7/1974 327/156 |
| 2003/0023815 | A1* | 1/2003 | Yoneyama | G06F 3/0611 711/133 |
| 2006/0044033 | A1* | 3/2006 | Kim | G11C 7/1051 327/158 |
| 2008/0232180 | A1* | 9/2008 | Kim | G11C 7/1051 365/194 |
| 2010/0123494 | A1* | 5/2010 | Heightley | G11C 7/1051 327/158 |
| 2011/0085387 | A1* | 4/2011 | Lee | G06Q 30/0251 365/189.02 |
| 2011/0204936 | A1* | 8/2011 | Brenndorfer | H03J 3/00 327/156 |
| 2011/0260763 | A1* | 10/2011 | Wang | H03L 7/087 327/157 |
| 2013/0278303 | A1* | 10/2013 | Chen | H03L 7/101 327/117 |
| 2014/0032815 | A1* | 1/2014 | Mangalindan | G06F 13/4243 711/103 |
| 2015/0022386 | A1* | 1/2015 | Lam | H03M 3/38 341/120 |
| 2015/0130518 | A1* | 5/2015 | Chen | H03L 7/0802 327/142 |
| 2015/0346761 | A1* | 12/2015 | Shiraishi | G06F 1/12 713/401 |
| 2015/0372683 | A1* | 12/2015 | Takahashi | G11C 11/4076 365/233.1 |

FOREIGN PATENT DOCUMENTS

| KR | 101208961 B1 | 11/2012 |
|---|---|---|
| KR | 1020140019941 A | 2/2014 |

* cited by examiner

*Primary Examiner* — Adam Houston
(74) *Attorney, Agent, or Firm* — William Park & Associates Ltd.

(57) ABSTRACT

A semiconductor apparatus may include a delay-locked loop configured to generate a delay-locked clock signal through a delay locking operation of an internal clock signal and an external clock signal, and delay an internal read command by a delay time tuned in the delay locking operation and generate a delay-locked internal command. The semiconductor apparatus may include a tuning control block configured to generate the internal read command in response to a self-tuning enable signal generated by determining a delay locking completion time of the delay-locked loop. The semiconductor apparatus may include a timing tuning block configured to generate delay control signals according to a phase difference of the delay-locked clock signal and the delay-locked internal command, and tune a delay time of the internal read command according to the delay control signals and generate a timing-tuned read command.

30 Claims, 24 Drawing Sheets

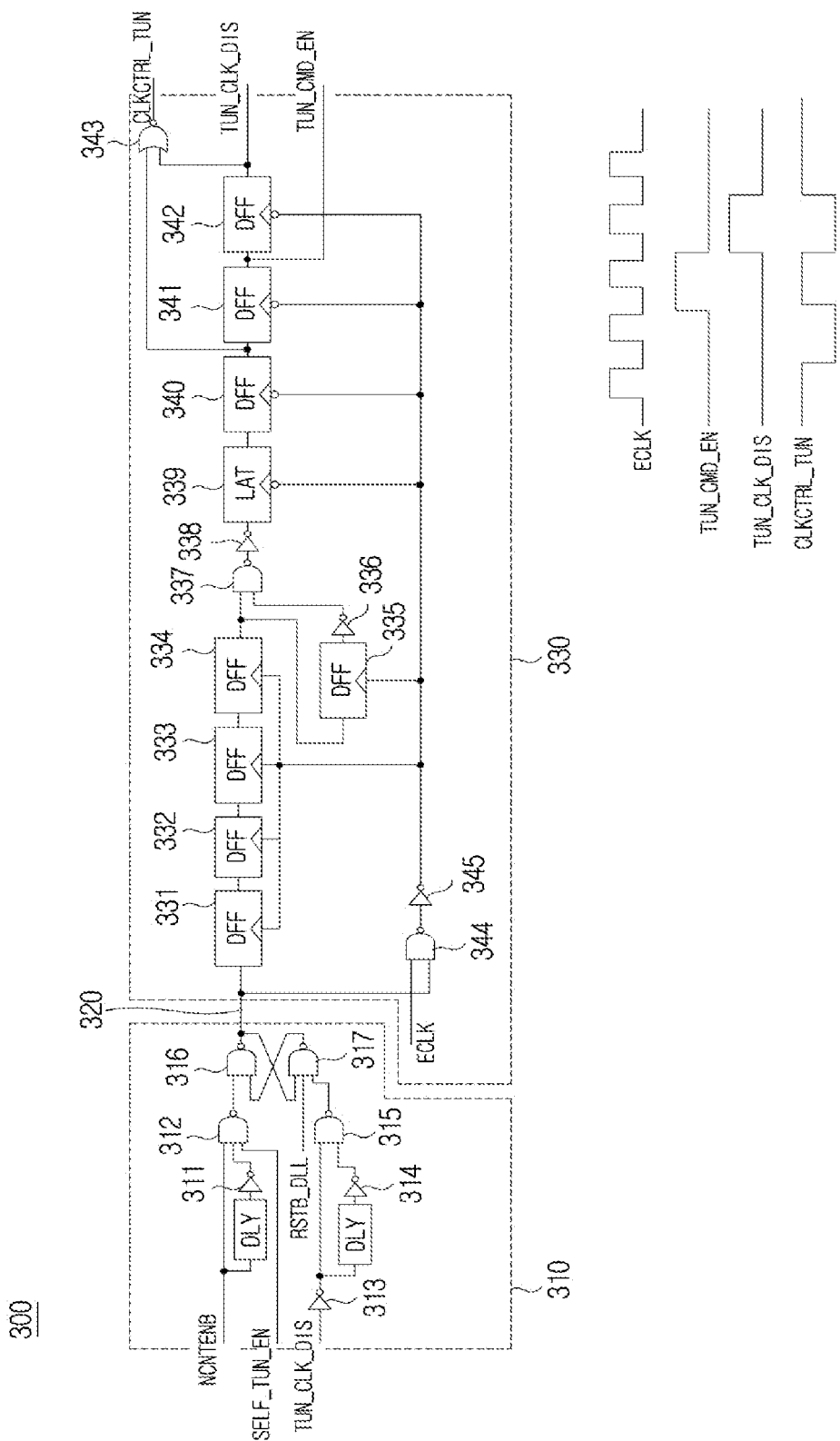

FIG.6
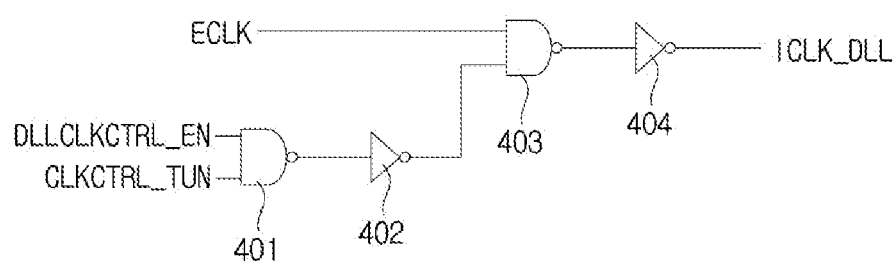
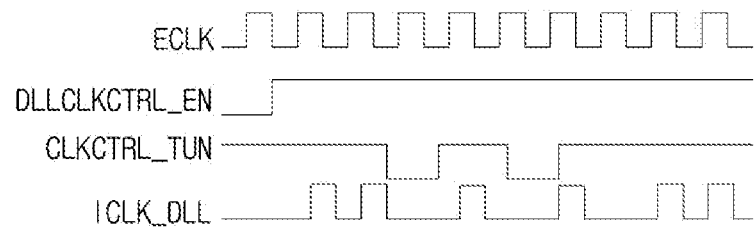

ICMD rising edge is later than DLLCLK as reference

SEMICONDUCTOR APPARATUS CAPABLE OF SELF-TUNING A TIMING MARGIN

CROSS-REFERENCES TO RELATED APPLICATION

The present application claims priority under 35 U.S.C. §119(a) to Korean application number 10-2014-0145310, filed on Oct. 24, 2014, in the Korean Intellectual Property Office, which is incorporated herein by reference in its entirety.

BACKGROUND

1. Technical Field

Various embodiments generally relate to a semiconductor circuit, and more particularly, to a semiconductor apparatus capable of self-tuning a timing margin.

2. Related Art

A semiconductor apparatus should receive an external command based on an external clock signal. The semiconductor apparatus may perform an operation according to the external command in conformity with a predetermined latency.

The latency may define that the operation according to the external command should be performed at which clock pulse from a clock pulse with which the external command is synchronized based on the external clock signal.

The semiconductor apparatus generates an internal clock signal for synchronizing data output or an on-die termination operation with the rising edge of the external clock, that is, a delay-locked loop clock signal, by using a delay-locked loop which models an internal signal path.

Accordingly, the semiconductor apparatus should synchronize an internal signal which determines a data output timing or an on-die termination timing, with the delay-locked loop clock signal.

However, as a variation occurs in PVT (process, voltage and temperature), the phase difference between the external command and the delay-locked loop clock signal may be distorted. This distortion may be beyond a predetermined margin, and accordingly, an operation error may be caused.

SUMMARY

In an embodiment, a semiconductor apparatus may include a delay-locked loop configured to generate a delay-locked clock signal through a delay locking operation of an internal clock signal and an external clock signal, and delay an internal read command by a delay time tuned in the delay locking operation and generate a delay-locked internal command. The semiconductor apparatus may include a tuning control block configured to generate the internal read command in response to a self-tuning enable signal, the self-tuning enable signal generated by determining a delay locking completion time of the delay-locked loop. The semiconductor apparatus may include a timing tuning block configured to generate delay control signals according to a phase difference of the delay-locked clock signal and the delay-locked internal command, and tune a delay time of the internal read command according to the delay control signals and generate a timing-tuned read command.

In an embodiment, a semiconductor apparatus may include a delay-locked loop configured to generate a delay-locked clock signal through a delay locking operation of an internal clock signal and an external clock signal, and delay an internal read command or an internal write command by a delay time tuned in the delay locking operation and generate a delay-locked internal command. The semiconductor apparatus may include a tuning control block configured to generate the internal read command in response to a self-tuning enable signal generated by determining a delay locking completion time of the delay-locked loop. The semiconductor apparatus may include a timing tuning block configured to generate delay control signals according to a phase difference of the delay-locked clock signal and the delay-locked internal command, and tune a delay time of the internal read command or an on-die termination command according to the delay control signals and generate a timing-tuned read command or a timing-tuned on-die termination command.

In an embodiment, a semiconductor apparatus may include a delay-locked loop configured to generate a delay-locked clock signal through a delay locking operation of an internal clock signal and an external clock signal, and delay an internal write command by a delay time tuned in the delay locking operation and generate a delay-locked internal command. The semiconductor apparatus may include a tuning control block configured to generate the internal write command in response to a self-tuning enable signal generated by determining a delay locking completion time of the delay-locked loop. The semiconductor apparatus may include a timing tuning block configured to generate delay control signals according to a phase difference of the delay-locked clock signal and the delay-locked internal command, and tune a delay time of an internal read command according to the delay control signals and generate a timing-tuned read command.

BRIEF DESCRIPTION OF THE DRAWINGS

FIG. 5 is a circuit diagram illustrating a representation of an example of the virtual command generation unit illustrated in FIG. 2.

FIG. 6 is a circuit diagram illustrating a representation of an example of the internal clock generation unit illustrated in FIG. 2.

DETAILED DESCRIPTION

Hereinafter, a semiconductor apparatus capable of self-tuning a timing margin will be described below with reference to the accompanying drawings through various examples of embodiments.

In embodiments disclosed herein, a virtual command may be internally generated without the control of an exterior, for example, a memory controller, the phase difference between the virtual command, which is delay-locked through a delay-locked loop, and a delay-locked clock signal, which is outputted from the delay-locked loop, is detected, and the timings of a read command, the delay-locked clock signal (DLLCLK), an on-die termination command and a write command may be tuned in conformity with the detected phase difference.

Also, by tuning the latencies of the read command, the delay-locked clock signal, the on-die termination command and the write command which are tuned in the timings thereof, a data output timing and an on-die termination operation timing may be determined.

Figure 1:
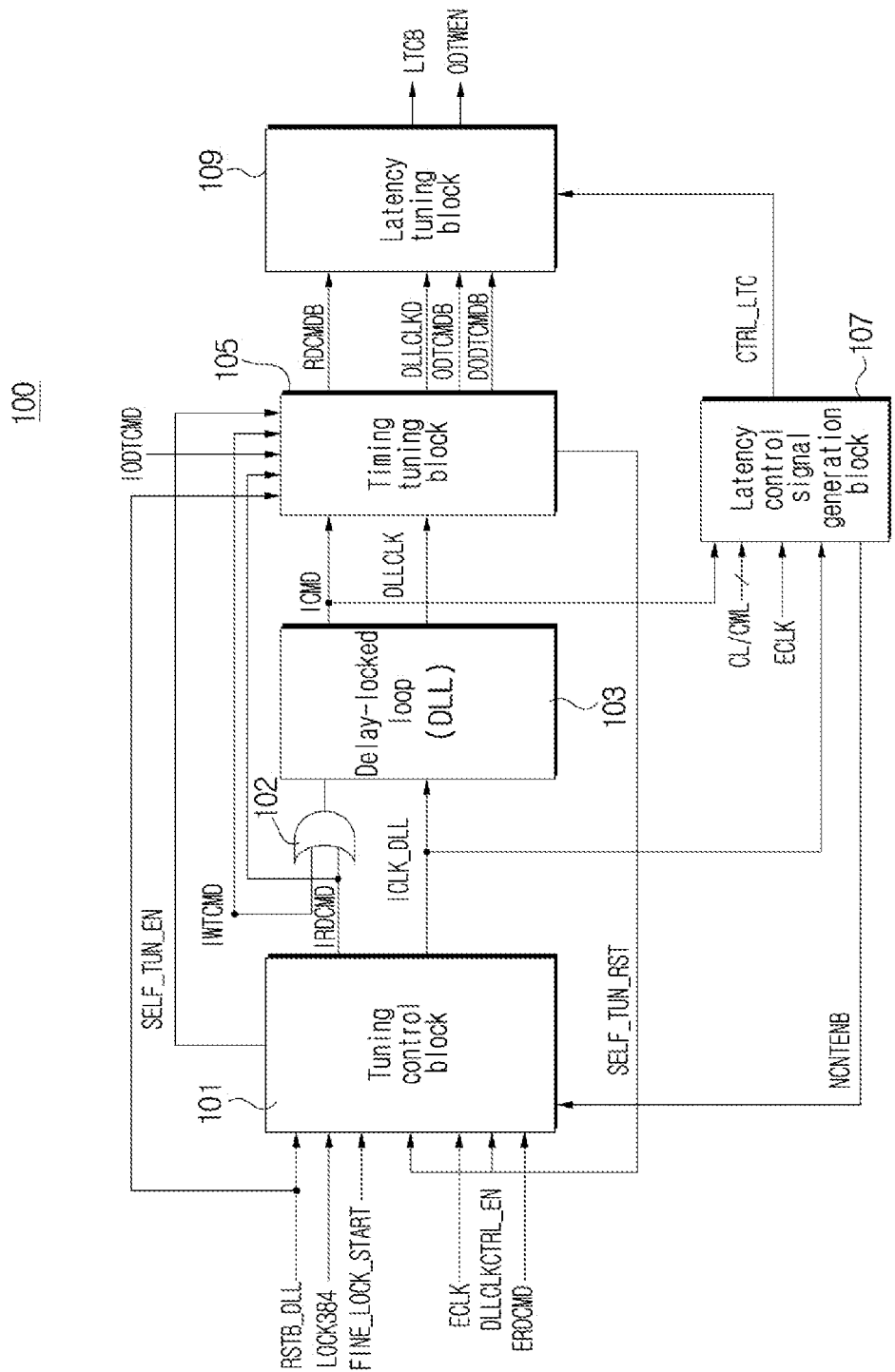
FIG. 1 is a block diagram illustrating a representation of an example of a semiconductor apparatus in accordance with an embodiment.

In an embodiment according to FIG. 1, a virtual command may be internally generated without the control of a memory controller, an internal read command may be generated using the virtual command, the phase difference between the internal read command, which is delay-locked through a delay-locked loop, and a delay-locked clock signal, which is outputted from the delay-locked loop, is detected, and the timings of a read command, the delay-locked clock signal (DLLCLK), an on-die termination command and a write command may be tuned in conformity with the detected phase difference.

As illustrated in FIG. 1, a semiconductor apparatus 100 in accordance with an embodiment may include a tuning control block 101, a delay-locked loop (DLL) 103, and a timing tuning block 105.

The semiconductor apparatus 100 in accordance with the embodiments may further include a logic gate 102, a latency control signal generation block 107, and a latency tuning block 109.

The tuning control block 101 may be configured to generate an internal read command IRDCMD in response to a self-tuning enable signal SELF_TUN_EN. The self-tuning enable signal SELF_TUN_EN may be generated by determining the delay locking completion time of the delay-locked loop 103. The tuning control block 101 may be configured to generate a first internal clock signal ICLK_DLL using an external clock signal ECLK.

The delay-locked loop 103 may be configured to generate a delay-locked clock signal DLLCLK through a delay locking operation of the first internal clock signal ICLK_DLL and the external clock signal ECLK. The delay-locked loop 103 may be configured to generate a delay-locked internal command ICMD by delaying the internal read command IRDCMD or an internal write command IWTCMD by a delay time tuned in the delay locking operation.

The logic gate 102 may OR or perform an OR logic function on the internal read command IRDCMD and the internal write command IWTCMD. The logic gate 102 may provide an output to the delay-locked loop 103.

The timing tuning block 105 may be configured to generate delay control signals DLY<0:5> (See FIG. 8) according to the phase difference between the delay-locked clock signal DLLCLK and the delay-locked internal command ICMD, and may be configured to tune the delay time of the internal read command IRDCMD, the internal write command IWTCMD or an on-die termination command according to the delay control signals DLY<0:5>. The timing tuning block 105 may be configured to generate a timing-tuned read command RDCMDB, a timing-tuned dynamic on-die termination command DODTCMDB or a timing-tuned on-die termination command ODTCMDB.

The latency control signal generation block 107 may be configured to generate a latency control signal CTRL_LTC in response to the external clock signal ECLK, the delay-locked internal command ICMD, a CAS latency CL and a CAS write latency CWL.

The CAS latency CL may be a value that defines at which clock pulse from a clock pulse with which a read command is synchronized based on the external clock signal ECLK first data should be outputted through an input/output pin (DQ).

The CAS write latency CWL may be a value that defines at which clock pulse from a clock pulse with which an on-die termination command/a dynamic on-die termination command is synchronized based on the external clock signal ECLK a termination operation for the input/output pin (DQ) should be performed.

The latency tuning block 109 may be configured to tune the latency of the timing-tuned read command RDCMDB, the timing-tuned on-die termination command ODTCMDB or the timing-tuned dynamic on-die termination command DODTCMDB according to the latency control signal CTRL_LTC. The latency tuning block 109 may be configured to output a data output enable signal LTCB or an on-die termination enable signal ODTWEN.

The tuning control block 101 may be configured to generate the self-tuning enable signal SELF_TUN_EN, the internal read command IRDCMD and the first internal clock signal ICLK_DLL in response to a delay-locked loop reset signal RSTB_DLL, a locking time lapse signal LOCK384, a fine locking start signal FINE_LOCK_START, a latency calculation enable signal NCNTENB, the external clock signal ECLK, a delay-locked clock tuning enable signal DLLCLKCTRL_EN, an external read command ERDCMD and a self-tuning reset signal SELF_TUN_RST.

The delay-locked loop 103 may be configured to generate the delay-locked internal command ICMD and the delay-locked clock signal DLLCLK in response to the output of the logic gate 102 and the first internal clock signal ICLK_DLL.

The delay-locked loop 103 may sequentially perform a primary delay locking operation and a secondary delay locking operation.

The primary delay locking operation may be referred to as coarse locking, and the secondary delay locking operation may be referred to as fine locking.

The fine locking may be performed using a second delay line configured by unit delays with a shorter delay time than the unit delays of a first delay line used in the coarse locking.

The timing tuning block 105 may be configured to generate the self-tuning reset signal SELF_TUN_RST, the timing-tuned read command RDCMDB, a timing-tuned delay-locked clock signal DLLCLKD, the timing-tuned on-die termination command ODTCMDB and the timing-tuned dynamic on-die termination command DODTCMDB in response to the delay-locked loop reset signal RSTB_DLL, the internal read command IRDCMD, the internal write command IWTCMD, an internal on-die termination command IODTCMD, the self-tuning enable signal SELF_TUN_EN, the delay-locked internal command ICMD and the delay-locked clock signal DLLCLK.

The latency control signal generation block 107 may be configured to generate the latency calculation enable signal NCNTENB and the latency control signal CTRL_LTC in response to the delay-locked internal command ICMD, the CAS latency CL, the CAS write latency CWL, the external clock signal ECLK and the first internal clock signal ICLK_DLL.

The latency calculation enable signal NCNTENB may be a signal which may be enabled as latency calculation, that is, an 'N' value calculating operation (see FIG. 12) is completed.

The latency tuning block 109 may be configured to generate the data output enable signal LTCB or the on-die termination enable signal ODTWEN in response to the latency control signal CTRL_LTC, the timing-tuned read command RDCMDB, the timing-tuned delay-locked clock signal DLLCLKD, the timing-tuned on-die termination command ODTCMDB and the timing-tuned dynamic on-die termination command DODTCMDB.

Figure 2:
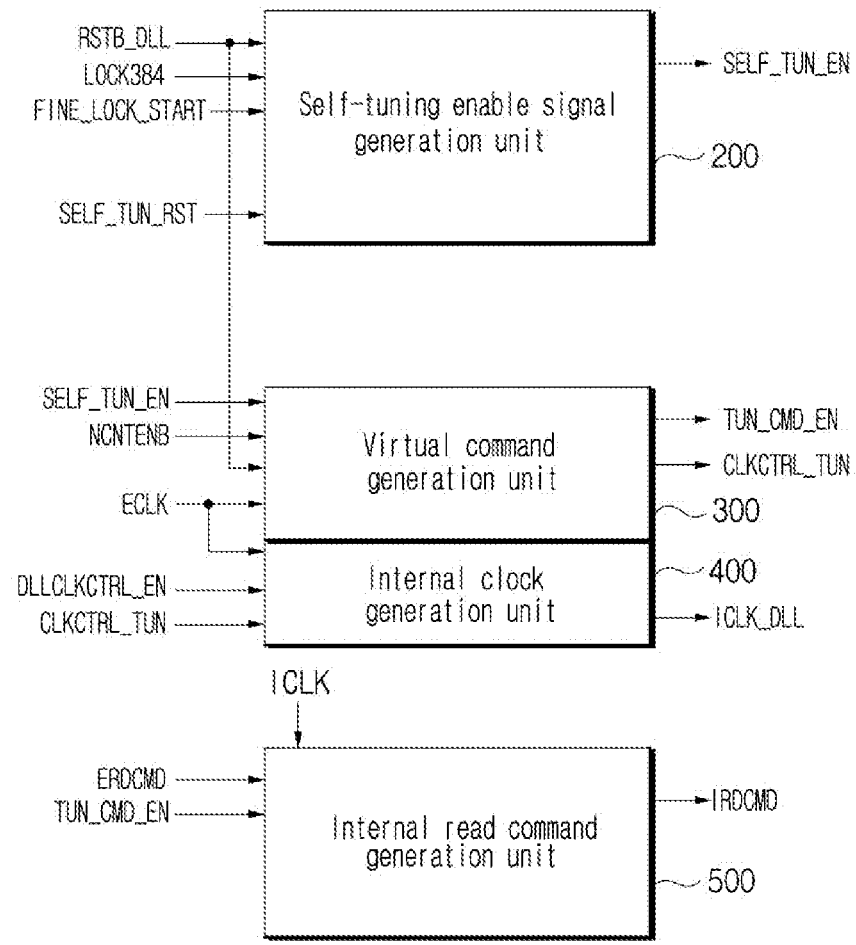
FIG. 2 is a block diagram illustrating a representation of an example of the tuning control block illustrated in FIG. 1.

As illustrated in FIG. 2, the tuning control block 101 may include a self-tuning enable signal generation unit 200, a virtual command generation unit 300, an internal clock generation unit 400, and an internal read command generation unit 500.

The self-tuning enable signal generation unit 200 may be configured to enable the self-tuning enable signal SELF_TUN_EN. The self-tuning enable signal SELF_TUN_EN may be enabled when the delay locking completion time is within a predetermined time.

The virtual command generation unit 300 may be configured to generate a virtual command TUN_CMD_EN and a clock mask signal CLKCTRL_TUN. The virtual command TUN_CMD_EN and a clock mask signal CLKCTRL_TUN may be generated by the virtual command generation unit 300 in response to the self-tuning enable signal SELF_TUN_EN and the external clock signal ECLK.

The internal clock generation unit 400 may be configured to generate the first internal clock signal ICLK_DLL. The first internal clock signal ICLK_DLL may be generated by the internal clock generation unit 400 in response to the external clock signal ECLK and the clock mask signal CLKCTRL_TUN.

The internal read command generation unit 500 may be configured to generate the internal read command IRDCMD. The internal read command IRDCMD may be generated by the internal read command generation unit 500 in response to the external read command ERDCMD or the virtual command TUN_CMD_EN.

The self-tuning enable signal generation unit 200 may be configured to generate the self-tuning enable signal SELF_TUN_EN. The self-tuning enable signal SELF_TUN_EN may be generated by the self-tuning enable signal generation unit 200 in response to the delay-locked loop reset signal RSTB_DLL, the locking time lapse signal LOCK384, the fine locking start signal FINE_LOCK_START and the self-tuning reset signal SELF_TUN_RST.

The virtual command generation unit 300 may be configured to generate the virtual command TUN_CMD_EN and the clock mask signal CLKCTRL_TUN in response to the self-tuning enable signal SELF_TUN_EN, the latency calculation enable signal NCNTENB, the delay-locked loop reset signal RSTB_DLL and the external clock signal ECLK.

The internal clock generation unit 400 may be configured to generate the first internal clock signal ICLK_DLL in response to the external clock signal ECLK, the delay-locked clock tuning enable signal DLLCLKCTRL_EN and the clock mask signal CLKCTRL_TUN.

The internal read command generation unit 500 may be configured to generate the internal read command IRDCMD in response to the external read command ERDCMD, the virtual command TUN_CMD_EN and a second internal clock signal ICLK.

In the following descriptions, it will be assumed that the enablement and disablement of the delay-locked loop reset signal RSTB_DLL and the latency calculation enable signal NCNTENB correspond to the logic low levels and the logic high levels of the corresponding signals.

It will be assumed that the enablement and disablement of the remaining signals excluding the delay-locked loop reset signal RSTB_DLL and the latency calculation enable signal NCNTENB correspond to the logic high levels and the logic low levels of the corresponding signals.

Figure 3:
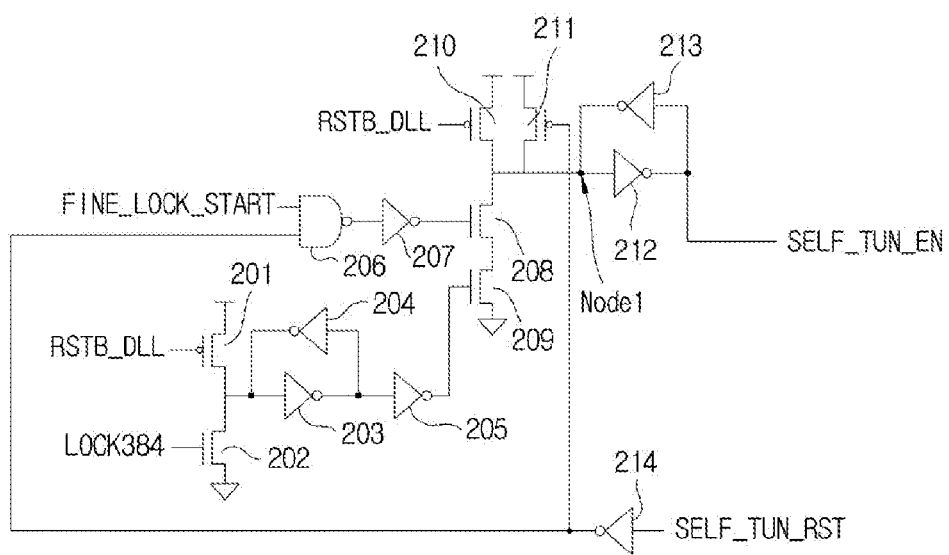
FIG. 3 is a circuit diagram illustrating a representation of an example of the self-tuning enable signal generation unit illustrated in FIG. 2.

As illustrated in FIG. 3, the self-tuning enable signal generation unit 200 may include a plurality of logic gates 201 to 214.

The logic gates 201 to 205 output the level of a power supply terminal or the level of a ground terminal according to the delay-locked loop reset signal RSTB_DLL and the locking time lapse signal LOCK384.

The logic gate 214 inverts the self-tuning reset signal SELF_TUN_RST and outputs an output.

The logic gates 206 to 209 apply the level of the ground terminal to a node Node1 according to the fine locking start signal FINE_LOCK_START and the output of the logic gate 214.

The logic gates 210 and 211 apply the level of the power supply terminal to the node Node1 according to the delay-locked loop reset signal RSTB_DLL or the output of the logic gate 214.

The logic gates 212 and 213 latch the logic level of the node Node1 and output the self-tuning enable signal SELF_TUN_EN.

Operations of the self-tuning enable signal generation unit 200 will be described below with reference to FIGS. 3, 4A and 4B.

In the embodiments, the high frequency operation and the low frequency operation of the semiconductor apparatus 100 may be identified such that a self-tuning operation is not performed in the low frequency operation by retaining the self-tuning enable signal SELF_TUN_EN in a disabled state and a self-tuning operation is performed in the high frequency operation by enabling the self-tuning enable signal SELF_TUN_EN.

The locking time lapse signal LOCK384 and the fine locking start signal FINE_LOCK_START may be used as multiple information. This multiple information may be used for identifying the high frequency operation and the low frequency operation.

The locking time lapse signal LOCK384 is a signal enabled after the predetermined time, for example, 384tCK, after the delay locking operation of the delay-locked loop 103 is started.

The fine locking start signal FINE_LOCK_START is a signal enabled as the fine locking of the delay-locked loop 103 is started.

Figure 4A:
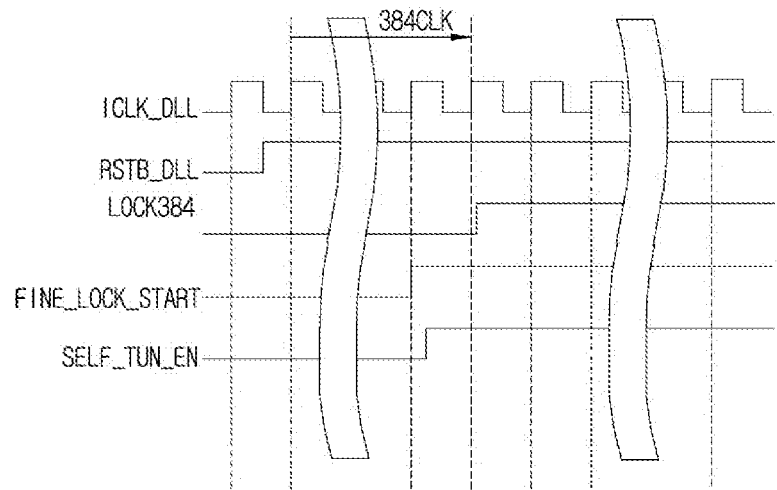
FIGS. 4A and 4B are representations of examples of timing diagrams to assist in the explanation of the operations of the self-tuning enable signal generation unit illustrated in FIG. 3.

As illustrated in FIG. 4A, the self-tuning enable signal SELF_TUN_EN is initialized, that is, disabled, by the enablement of the delay-locked loop reset signal RSTB_DLL.

Thereafter, as the fine locking of the delay-locked loop 103 is started, the fine locking start signal FINE_LOCK_START is enabled.

Since the locking time lapse signal LOCK384 is not enabled at a time when the fine locking start signal FINE_LOCK_START is enabled, the self-tuning enable signal SELF_TUN_EN is enabled.

That is to say, since the fine locking has been started within 384tCK after the operation of the delay-locked loop 103 is started, it is determined that the semiconductor apparatus 100 performs the high frequency operation, and the self-tuning enable signal SELF_TUN_EN is enabled.

Figure 4B:
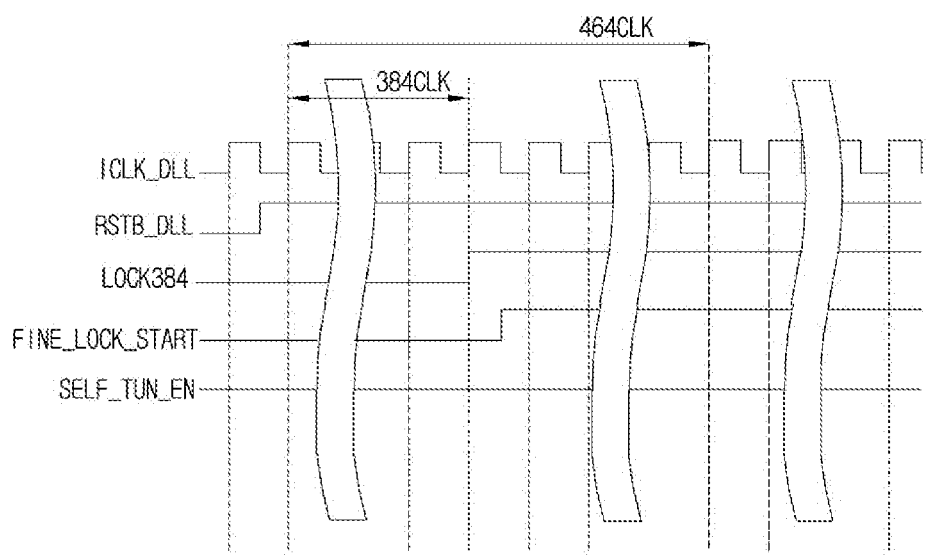

As illustrated in FIG. 4B, the self-tuning enable signal SELF_TUN_EN is initialized, that is, disabled, by the enablement of the delay-locked loop reset signal RSTB_DLL.

Thereafter, as the fine locking of the delay-locked loop 103 is started, the fine locking start signal FINE_LOCK_START is enabled.

Since the locking time lapse signal LOCK384 has already been enabled at a time when the fine locking start signal FINE_LOCK_START is enabled, the self-tuning enable signal SELF_TUN_EN is disabled.

That is to say, since the fine locking has been started after 384tCK after the operation of the delay-locked loop 103 is started, it is determined that the semiconductor apparatus 100 performs the low frequency operation, and the enablement of the self-tuning enable signal SELF_TUN_EN is masked.

As illustrated in FIG. 5, the virtual command generation unit 300 may include a source signal generating section 310, and a synchronizing delay section 330.

The source signal generating section 310 may be configured to generate a source signal 320. The source signal 320 may be generated by the source signal generating section 310 in response to the enablement of the self-tuning enable signal SELF_TUN_EN.

The source signal generating section 310 may be configured to generate the source signal 320. The source signal 320 may be generated by the source signal generating section 310 in response to the latency calculation enable signal NCNTENB, the self-tuning enable signal SELF_TUN_EN and a source disable signal TUN_CLK_DIS.

The source signal generating section 310 may include a plurality of logic gates 311 to 317, and a plurality of delays DLY.

The plurality of logic gates 311, 312 and 316 generate the source signal 320. The plurality of logic gates 311, 312 and 316 may generate the source signal 320 when the self-tuning enable signal SELF_TUN_EN is enabled and the latency calculation enable signal NCNTENB is disabled as latency calculation is ended.

The plurality of logic gates 313 to 315 and 317 disable the source signal 320. The plurality of logic gates 313 to 315 and 317 may disable the source signal 320 using a pulse signal generated according to the source disable signal TUN_CLK_DIS. The logic gate 317 is configured to receive the delay locked loop reset signal RSTB_DLL as well as the outputs of logic gates 315 and 316, and output an output to logic gate 316.

The synchronizing delay section 330 may be configured to delay the source signal 320 to synchronize the source signal 320 with the external clock signal ECLK. The synchronizing delay section 330 may be configured to generate the virtual command TUN_CMD_EN, the clock mask signal CLKCTRL_TUN and the source disable signal TUN_CLK_DIS.

The synchronizing delay section 330 may include a plurality of flip-flops (DFF) 331 to 335 and 340 to 342, a latch (LAT) 339, and a plurality of logic gates 336 to 338 and 343 to 345.

The logic gates 344 and 345 AND or perform an AND logic function on the external clock signal ECLK and the source signal 320, and output an output.

The plurality of flip-flops 331 to 335 shift the source signal 320 according to the output of the logic gate 345, and output outputs.

The logic gate 336 inverts the output of the flip-flop 335, and outputs an output.

The logic gates 337 and 338 AND or perform an AND logic function on the output of the flip-flop 334 and the output of the logic gate 336, and output an output.

The latch 339 and the plurality of flip-flops 340 to 342 shift the output of the logic gate 338 according to the output of the logic gate 345, and output outputs.

The output of the flip-flop 341 is outputted as the virtual command TUN_CMD_EN.

The output of the flip-flop 342 is outputted as the source disable signal TUN_CLK_DIS.

The logic gate 343 NORs or performs a NOR logic function on the output of the flip-flop 340 and the source disable signal TUN_CLK_DIS, and outputs the clock mask signal CLKCTRL_TUN.

As illustrated in FIG. 6, the internal clock generation unit 400 may include a plurality of logic gates 401 to 404.

The logic gates 401 and 402 AND or perform an AND logic function on the delay-locked clock tuning enable signal DLLCLKCTRL_EN and the clock mask signal CLKCTRL_TUN, and output an output.

The logic gates 403 and 404 AND or perform an AND logic function on the external clock signal ECLK and the output of the logic gate 402, and output the first internal clock signal ICLK_DLL.

The delay-locked clock tuning enable signal DLLCLKCTRL_EN is a signal defining whether it is possible to tune a delay-locked clock.

The internal clock generation unit 400 may output the remaining pulse signals excluding the clock pulses masked by the clock mask signal CLKCTRL_TUN among the clock pulses of the external clock signal ECLK, as the first internal clock signal ICLK_DLL during the enable period of the delay-locked clock tuning enable signal DLLCLKCTRL_EN.

The timing margin of a self-tuning operation may be secured using the clock mask signal CLKCTRL_TUN.

Figure 7:
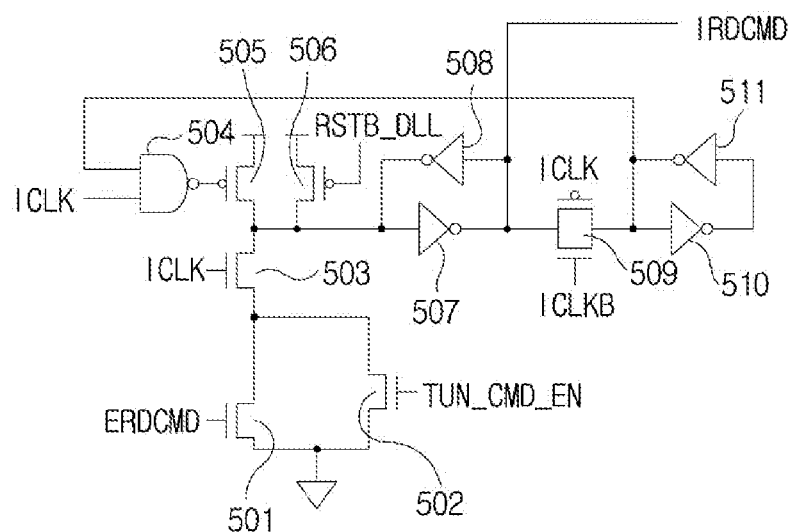
FIG. 7 is a circuit diagram illustrating a representation of an example of the internal read command generation unit illustrated in FIG. 2.

As illustrated in FIG. 7, the internal read command generation unit 500 may include a plurality of logic gates 501 to 511.

The logic gates 501 to 503, 507 and 508 transition the internal read command IRDCMD to a logic high according to the second internal clock signal ICLK when the virtual command TUN_CMD_EN is inputted.

The logic gates 501 to 503, 507 and 508 transition the internal read command IRDCMD to the logic high according to the second internal clock signal ICLK even in the examples where the external read command ERDCMD is inputted.

The logic gates 504, 505 and 509 to 511 transition the internal read command IRDCMD to a logic low according to the internal read command IRDCMD and the second internal clock signal ICLK, such that the internal read command IRDCMD has a predetermined pulse width.

In other words, the logic gates 509 to 511 latch the output of the logic gate 507 in response to the falling edge of the second internal clock signal ICLK. The logic gate 504 NANDs or performs a NAND logic function on the second internal clock signal ICLK and the output of the logic gate 511, and outputs an output. The logic gate 505 transitions the internal read command IRDCMD to the logic low according to the output of the logic gate 504.

The logic gate 506 resets the internal read command IRDCMD according to the delay-locked loop reset signal RSTB_DLL.

Figure 8:
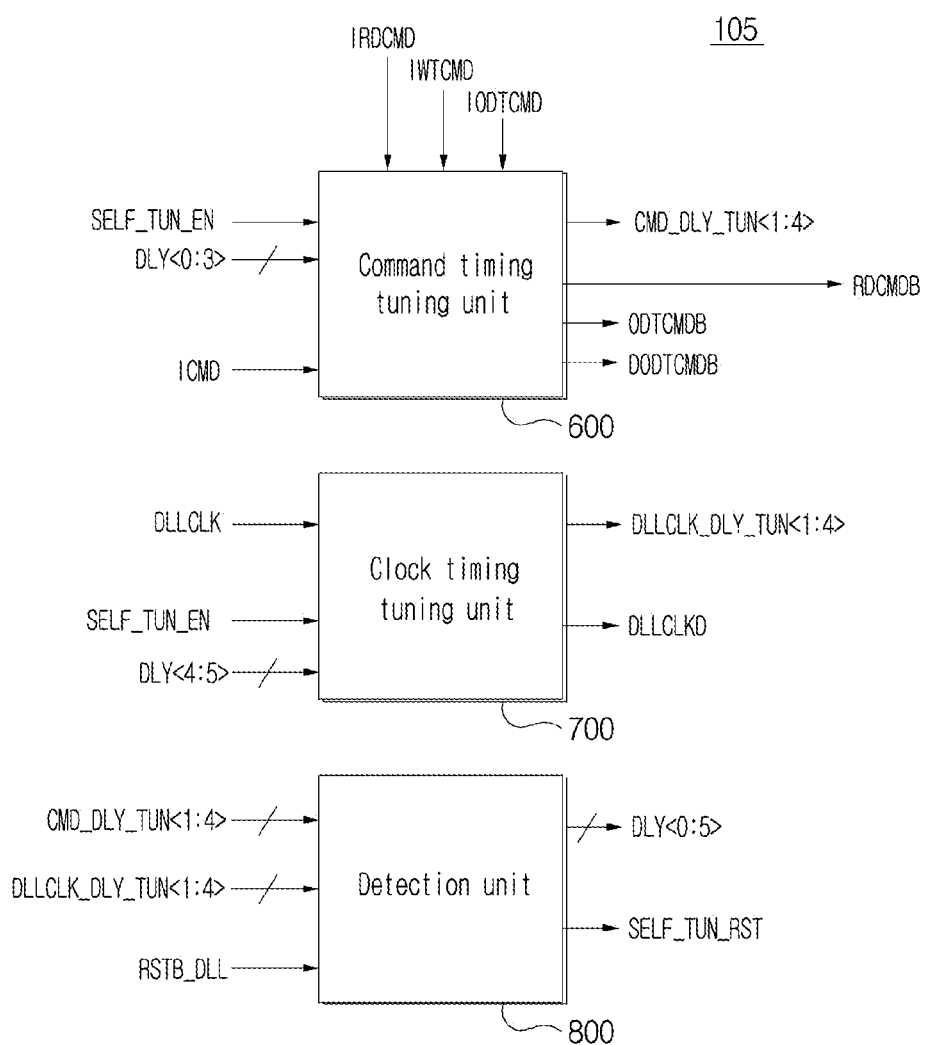
FIG. 8 is a block diagram illustrating a representation of an example of the timing tuning block illustrated in FIG. 1.

As illustrated in FIG. 8, the timing tuning block 105 may include a command timing tuning unit 600, a clock timing tuning unit 700, and a detection unit 800.

The command timing tuning unit 600 may be configured to delay the internal read command IRDCMD, the internal write command IWTCMD or the on-die termination command according to the delay control signals DLY<0:3> and generate the timing-tuned read command RDCMDB, the timing-tuned dynamic on-die termination command DODTCMDB or the timing-tuned on-die termination command ODTCMDB, and pass the delay-locked internal command ICMD through a delay path which is formed by replicating the delay path of the timing-tuned read command RDCMDB, in response to the self-tuning enable signal SELF_TUN_EN, and output command path replica signals CMD_DLY_TUN<1:4>.

The command timing tuning unit 600 may generate the command path replica signals CMD_DLY_TUN<1:4>, the timing-tuned read command RDCMDB, the timing-tuned on-die termination command ODTCMDB and the timing-tuned dynamic on-die termination command DODTCMDB in response to the self-tuning enable signal SELF_TUN_EN, the delay control signals DLY<0:3>, the delay-locked internal command ICMD, the internal read command IRDCMD, the internal write command IWTCMD and the internal on-die termination command IODTCMD.

The clock timing tuning unit 700 may be configured to tune the delay time of the delay-locked clock signal DLLCLK according to the delay control signals DLY<4:5> and output the timing-tuned delay-locked clock signal DLLCLKD, and pass the delay-locked clock signal DLLCLK through a delay path which is formed by replicating the delay path of the timing-tuned delay-locked clock signal DLLCLKD, according to the self-tuning enable signal SELF_TUN_EN, and output delay-locked clock path replica signals DLLCLK_DLY_TUN<1:4>.

The clock timing tuning unit 700 may generate the delay-locked clock path replica signals DLLCLK_DLY_TUN<1:4> and the timing-tuned delay-locked clock signal DLLCLKD in response to the delay-locked clock signal DLLCLK, the self-tuning enable signal SELF_TUN_EN and the delay control signals DLY<4:5>.

The detection unit 800 may be configured to detect the phase differences between the command path replica signals CMD_DLY_TUN<1:4> and the delay-locked clock path replica signals DLLCLK_DLY_TUN<1:4>, and generate the delay control signals DLY<0:5> according to the detected phase differences.

The detection unit 800 may generate the delay control signals DLY<0:5> and the self-tuning reset signal SELF_TUN_RST in response to the command path replica signals CMD_DLY_TUN<1:4>, the delay-locked clock path replica signals DLLCLK_DLY_TUN<1:4> and the delay-locked loop reset signal RSTB_DLL.

Figure 9:
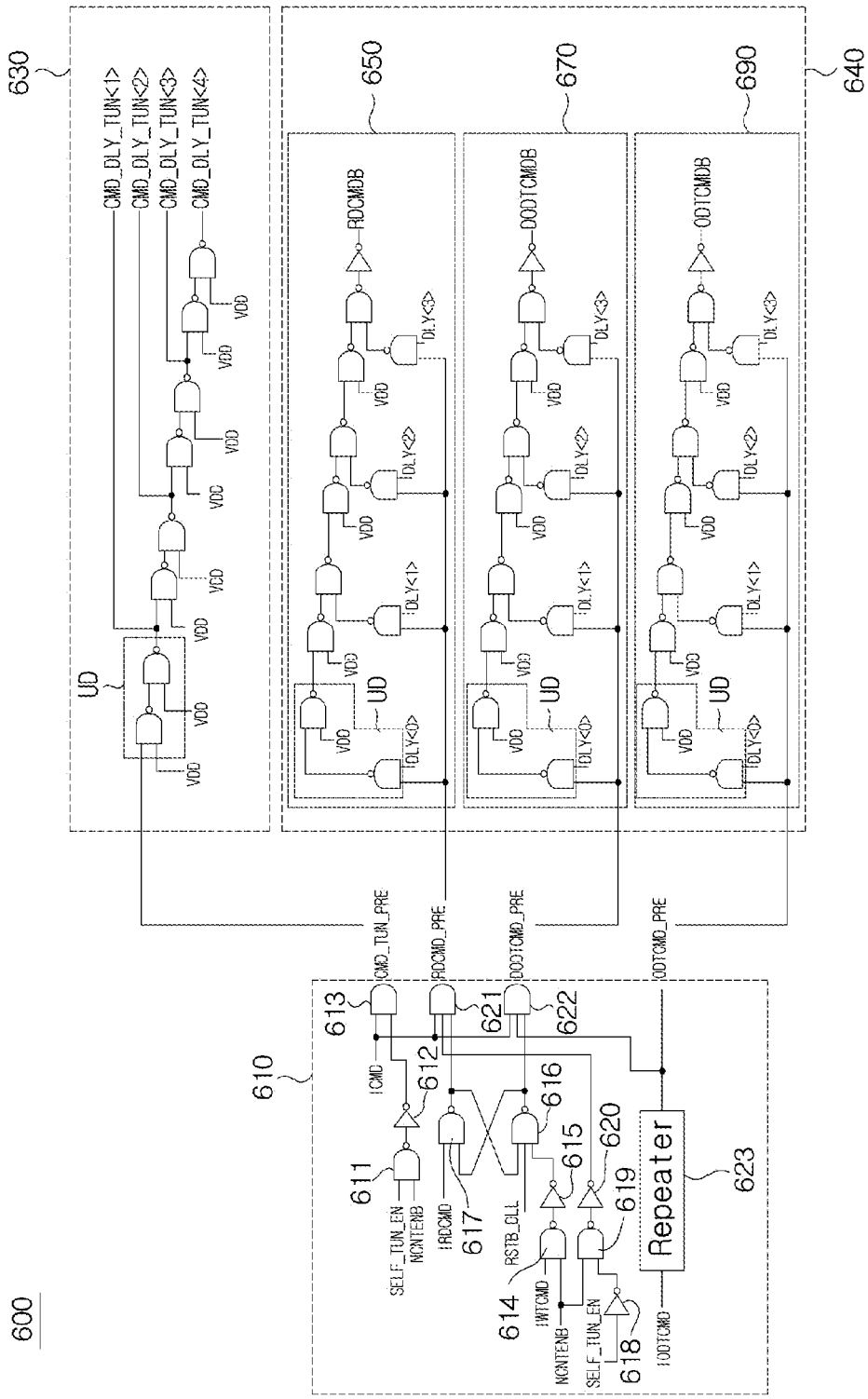
FIG. 9 is a circuit diagram illustrating a representation of an example of the command timing tuning unit illustrated in FIG. 8.

As illustrated in FIG. 9, the command timing tuning unit 600 may include a pre-signal generating section 610, a command path replicating section 630, and a command delay section 640.

The pre-signal generating section 610 may be configured to generate a pre-read command RDCMD_PRE, a pre-dynamic on-die termination command DODTCMD_PRE or a pre-on-die termination command ODTCMD_PRE in response to the internal read command IRDCMD, the internal write command IWTCMD or the on-die termination command, and generate a pre-tuning command CMD_TUN_PRE in response to the self-tuning enable signal SELF_TUN_EN and the delay-locked internal command ICMD.

The pre-signal generating section 610 may generate the pre-tuning command CMD_TUN_PRE, the pre-read command RDCMD_PRE, the pre-on-die termination command ODTCMD_PRE and the pre-dynamic on-die termination command DODTCMD_PRE in response to the delay-locked internal command ICMD, the self-tuning enable signal SELF_TUN_EN, the latency calculation enable signal NCNTENB, the internal read command IRDCMD, the delay-locked loop reset signal RSTB_DLL, the internal write command IWTCMD and the internal on-die termination command IODTCMD.

The pre-signal generating section 610 may include a plurality of logic gates 611 to 622, and a repeater 623.

The logic gate 611 may perform an NAND logic function on the self-tuning enable signal SELF_TUN_EN and the latency calculation enable signal NCNTENB, and output an output. The output of logic gate 611 is received by logic gate 612. Logic gate 612 may invert the output of logic gate 611 and output an output to logic gate 613.

The logic gate 613 ANDs or performs an AND logic function on the delay-locked internal command ICMD and the output of the logic gate 612, and outputs the pre-tuning command CMD_TUN_PRE.

The logic gate 614 may NAND or perform an NAND logic function on the internal write command IWTCMD and the latency calculation enable signal NCNTENB, and output an output. The output of logic gate 614 is received by logic gate 615. Logic gate 615 may invert the output of logic gate 614 and output an output to logic gate 616.

The logic gate 616 NANDs or performs a NAND logic function on the output of the logic gate 615, the delay-locked loop reset signal RSTB_DLL and the output of the logic gate 617, and outputs an output.

The logic gate 617 NANDs or performs a NAND logic function on the internal read command IRDCMD and the output of the logic gate 616, and outputs an output.

The logic gate 618 inverts the self-tuning enable signal SELF_TUN_EN, and outputs an output.

The logic gate 619 may NAND or perform an NAND logic function on the latency calculation enable signal NCNTENB and the output of the logic gate 618, and output an output. The output of logic gate 619 is received by logic gate 620. Logic gate 620 may invert the output of logic gate 619 and output an output to logic gate 622.

The repeater 623 repeats the internal on-die termination command IODTCMD, and outputs the pre-on-die termination command ODTCMD_PRE.

The logic gate 621 ANDs or performs an AND logic function on the delay-locked internal command ICMD, the output of the logic gate 620 and the output of the logic gate 617, and outputs the pre-read command RDCMD_PRE.

The logic gate 622 ANDs or performs an AND logic function on the delay-locked internal command ICMD, the output of the repeater 623 and the output of the logic gate 616, and outputs the pre-dynamic on-die termination command DODTCMD_PRE.

The command delay section 640 may be configured to delay the pre-read command RDCMD_PRE, the pre-dynamic on-die termination command DODTCMD_PRE or the pre-on-die termination command ODTCMD_PRE according to the delay control signals DLY<0:3>, and output the timing-tuned read command RDCMDB, the timing-tuned dynamic on-die termination command DODTCMDB or the timing-tuned on-die termination command ODTCMDB.

The command delay section 640 may include first to third delay paths 650, 670 and 690.

The first delay path 650 may delay the pre-read command RDCMD_PRE according to the delay control signals DLY<0:3>, and generate the timing-tuned read command RDCMDB.

The second delay path 670 may delay the pre-dynamic on-die termination command DODTCMD_PRE according to the delay control signals DLY<0:3>, and generate the timing-tuned dynamic on-die termination command DODTCMDB.

The third delay path 690 may delay the pre-on-die termination command ODTCMD_PRE according to the delay control signals DLY<0:3>, and generate the timing-tuned on-die termination command ODTCMDB.

The first delay path 650, the second delay path 670 and the third delay path 690 may be designed substantially the same, and each may include a plurality of unit delays UD which are designed to have the same delay time.

The command path replicating section 630 is configured by replicating any one of the first delay path 650, the second delay path 670 and the third delay path 690. The command path replicating section 630 may be configured to sequentially delay the pre-tuning command CMD_TUN_PRE, and output the command path replica signals CMD_DLY_TUN<1:4>.

The unit delay UD of the command path replicating section 630 may be designed to have the same or substantially the same delay time as the unit delay UD of the first delay path 650, the second delay path 670 and the third delay path 690. Power supply voltage VDD is illustrated in FIG. 9.

Figure 10:
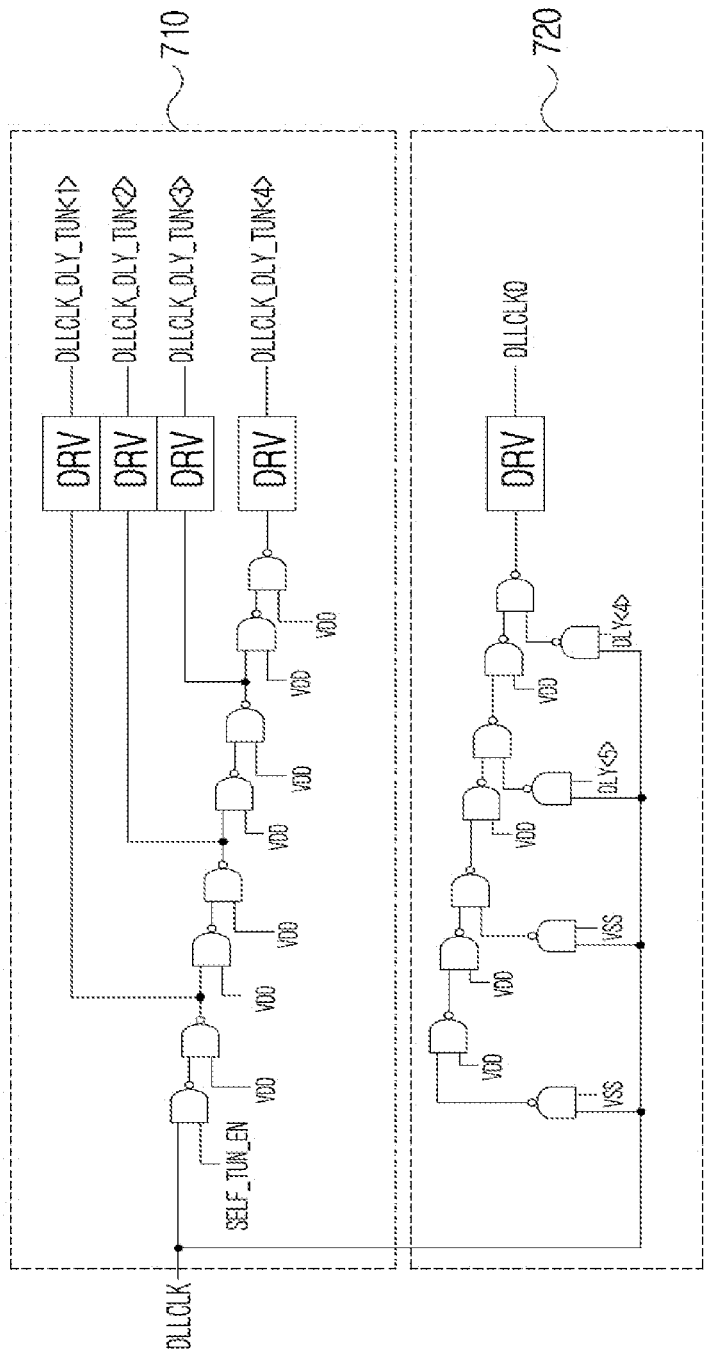
FIG. 10 is a circuit diagram illustrating a representation of an example of the clock timing tuning unit illustrated in FIG. 8.

As illustrated in FIG. 10, the clock timing tuning unit 700 may include a delay-locked clock delay section 720, and a delay-locked clock path replicating section 710.

The delay-locked clock delay section 720 may be configured to delay the delay-locked clock signal DLLCLK according to the delay control signals DLY<4:5>, and output the timing-tuned delay-locked clock signal DLLCLKD.

The delay-locked clock delay section 720 may include a plurality of unit delays UD which are designed to have the same delay time or substantially the same delay time, and a driver DRV for driving the respective outputs of the unit delays UD.

The delay-locked clock path replicating section 710 is configured by replicating the delay-locked clock delay section 720.

The delay-locked clock path replicating section 710 may be configured to sequentially delay the delay-locked clock signal DLLCLK according to the self-tuning enable signal SELF_TUN_EN, and output the delay-locked clock path replica signals DLLCLK_DLY_TUN<1:4>.

The delay-locked clock path replicating section 710 may include a plurality of unit delays UD designed to have the same delay time or substantially the same delay time, and a plurality of drivers DRV for driving the respective outputs of the unit delays UD.

The unit delay UD of the delay-locked clock path replicating section 710 may be designed to have the same delay time or substantially the same delay time as the unit delay UD of the delay-locked clock delay section 720. Power supply voltage VDD and ground voltage VSS is illustrated in FIG. 10.

Figure 11:
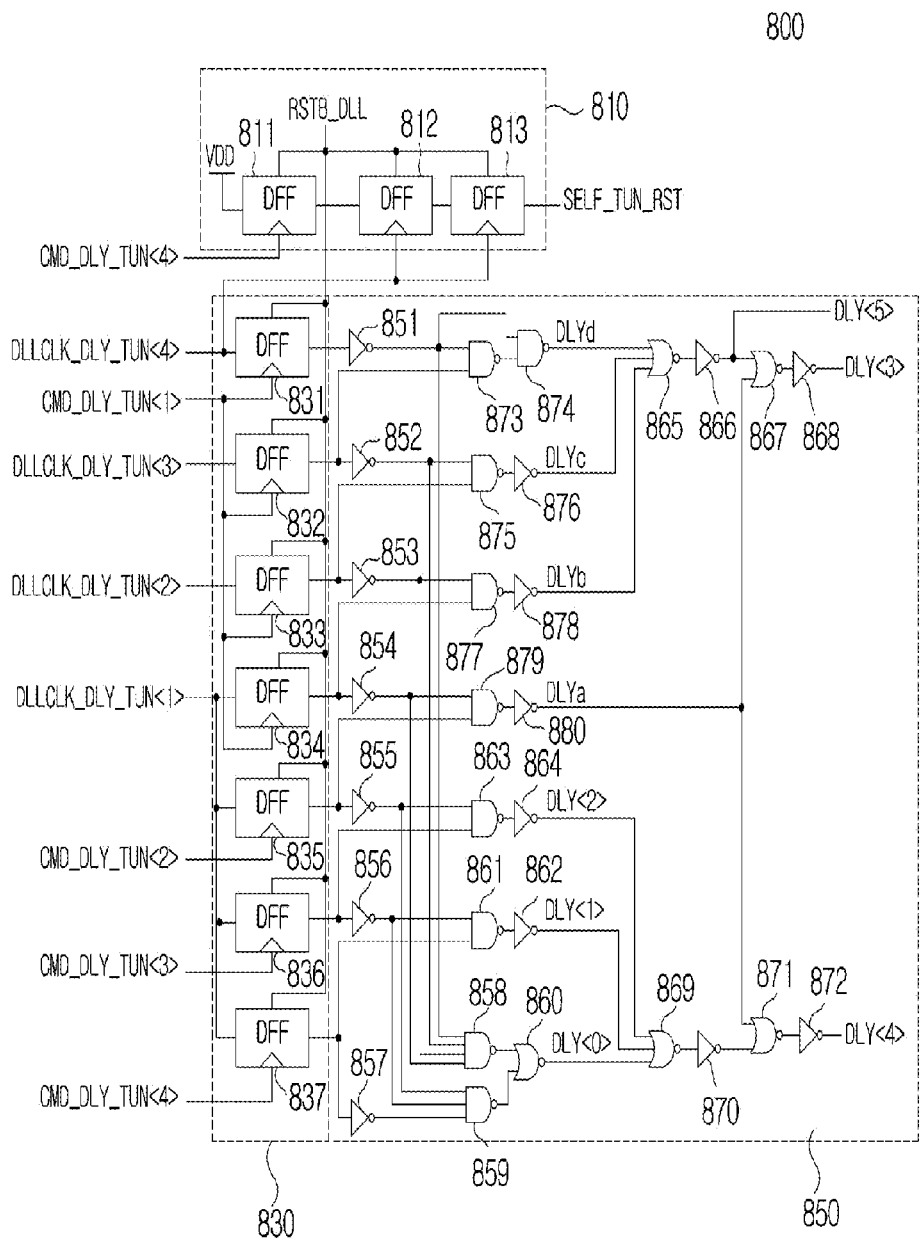
FIG. 11 is a circuit diagram illustrating a representation of an example of the detection unit illustrated in FIG. 8.

As illustrated in FIG. 11, the detection unit 800 may include a reset signal generating section 810, a comparing section 830, and a delay control signal generating section 850.

The reset signal generating section 810 may be configured to shift the level of a power supply voltage VDD according to any one of the command path replica signals CMD_DLY_TUN<1:4>, for example, the command path replica signal CMD_DLY_TUN<4>, and generate the self-tuning reset signal SELF_TUN_RST.

The reset signal generating section 810 may be configured to reset the self-tuning reset signal SELF_TUN_RST according to the delay-locked loop reset signal RSTB_DLL.

The reset signal generating section 810 may include a plurality of flip-flops 811 to 813.

The comparing section 830 may be configured to compare the phases of the command path replica signals CMD_DLY_TUN<1:4> and the delay-locked clock path replica signals DLLCLK_DLY_TUN<1:4>, and detect a plurality of phase difference signals.

The comparing section 830 may detect the plurality of phase difference signals by comparing the phases of the command path replica signals CMD_DLY_TUN<1:4> and the delay-locked clock path replica signals DLLCLK_DLY_TUN<1:4> in such a way as to latch the delay-locked clock path replica signals DLLCLK_DLY_TUN<1:4> according to the command path replica signals CMD_DLY_TUN<1:4>.

The comparing section 830 may include a plurality of flip-flops 831 to 837.

The flip-flops 831 to 834 latch the respective delay-locked clock path replica signals DLLCLK_DLY_TUN<4:1> among the delay-locked clock path replica signals DLLCLK_DLY_TUN<1:4>, according to any one of the command path replica signals CMD_DLY_TUN<1:4>, for example, the command path replica signal CMD_DLY_TUN<1>, and output phase difference signals.

The flip-flops 835 to 837 latch the delay-locked clock path replica signal DLLCLK_DLY_TUN<1> among the delay-locked clock path replica signals DLLCLK_DLY_TUN<1:4> according to the respective command path replica signals CMD_DLY_TUN<2:4> among the command path replica signals CMD_DLY_TUN<1:4>, and output phase difference signals.

The delay control signal generating section 850 may be configured to combine the plurality of phase difference signals outputted from the plurality of flip-flops 831 to 837, and output the delay control signals DLY<0:5>.

The delay control signal generating section 850 may include a plurality of logic gates 851 to 872.

The logic gates 851 to 857 invert the plurality of phase difference signals outputted from the plurality of flip-flops 831 to 837, and output outputs.

The logic gate 858 NANDs or performs a NAND logic function on the outputs of the logic gates 851 to 854, and outputs an output.

The logic gate 859 NANDs or performs a NAND logic function on the outputs of the logic gates 855 to 857, and outputs an output.

The logic gate 860 NORs or performs a NOR logic function on the outputs of the logic gates 858 and 859, and outputs the delay control signal DLY<0>.

The logic gate 861 may NAND or perform an NAND logic function on the output of the logic gate 856 and the output of the flip-flop 837, and output the delay control signal DLY<1>. The output of logic gate 861 is received by logic gate 862. Logic gate 862 may invert the output of logic gate 861 and output an output to logic gate 869.

The logic gate 863 may NAND or perform an NAND logic function on the output of the logic gate 855 and the output of the flip-flop 836, and output the delay control signal DLY<2>. The output of logic gate 863 is received by logic gate 864. Logic gate 864 may invert the output of logic gate 863 and output an output to logic gate 869.

The logic gate 873 NANDs or performs a NAND logic function on the output of the logic gate 851 and the output of the flip-flop 832, and outputs an output.

The logic gate 874 NANDs or performs a NAND logic function on the output of the logic gate 873 and the output of the logic gate 851, and generates an output signal DLYd.

The logic gate 875 may NAND or perform an NAND logic function on the output of the logic gate 852 and the output of the flip-flop 833, and generate an output. The output of logic gate 875 is received by logic gate 876. Logic gate 876 may invert the output of logic gate 875 and output an output signal DLYc.

The logic gate 877 may NAND or perform an NAND logic function on the output of the logic gate 853 and the output of the flip-flop 834, and generate an output. The output of logic gate 877 is received by logic gate 878. Logic gate 878 may invert the output of logic gate 877 and output an output signal DLYb.

The logic gate 879 may NAND or perform an NAND logic function on the output of the logic gate 854 and the output of the flip-flop 835, and generate an output. The output of logic gate 879 is received by logic gate 880. Logic gate 880 may invert the output of logic gate 879 and output an output signal DLYa.

The logic gates 865 and 866 OR or perform an OR logic function on the output signals DLYd, DLYc and DLYb, and output the delay control signal DLY<5>.

The logic gates 867 and 868 OR or perform an OR logic function on the delay control signal DLY<5> and the output signal DLYa, and output the delay control signal DLY<3>.

The logic gates 869 and 870 OR or perform an OR logic function on the delay control signals DLY<0>, DLY<1> and DLY<2>, and output an output.

The logic gates 871 and 872 OR or perform an OR logic function on the output of the logic gate 870 and the output signal DLYa, and output the delay control signal DLY<4>.

Figure 12:
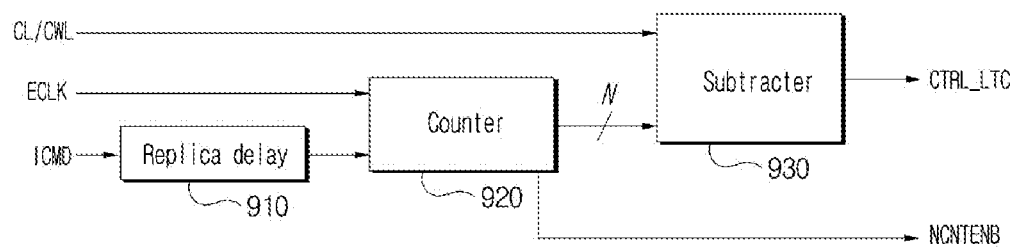
FIG. 12 is a block diagram illustrating a representation of an example of the latency control signal generation block illustrated in FIG. 1.

As illustrated in FIG. 12, the latency control signal generation block 107 may include a replica delay 910, a counter 920, and a subtracter 930.

The replica delay 910 may be configured to delay the delay-locked internal command ICMD by a predetermined delay time, and output an output.

The counter 920 may be configured to perform latency calculation in response to the external clock signal ECLK and the output of the replica delay 910, and generate a calculation result value N.

The counter 920 may be configured to count the number of clock pulses based on the external clock signal ECLK for a time until the internal read command IRDCMD is inputted via the delay-locked loop 103 and the replica delay 910, and output the calculation result value N.

The counter 920 may be configured to disable the latency calculation enable signal NCNTENB as the latency calculation is ended, that is, the calculation result value N is generated.

The subtracter 930 may be configured to output a value acquired by subtracting the calculation result value N from the column address strobe (CAS) latency CL, as the latency control signal CTRL_LTC, in a read operation.

The subtracter 930 may be configured to output a value acquired by subtracting the calculation result value N from the CAS write latency CWL, as the latency control signal CTRL_LTC, in a write operation.

Figure 13:
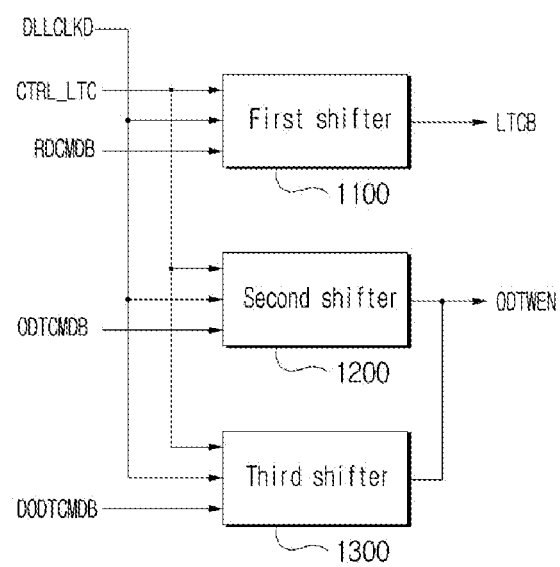
FIG. 13 is a block diagram illustrating a representation of an example of the latency tuning block illustrated in FIG. 1.

As illustrated in FIG. 13, the latency tuning block 109 may be configured to tune the latency of the timing-tuned read command RDCMDB, the timing-tuned on-die termination command ODTCMDB or the timing-tuned dynamic on-die termination command DODTCMDB, based on the timing-tuned delay-locked clock signal DLLCLKD, according to the latency control signal CTRL_LTC, and output the data output enable signal LTCB or the on-die termination enable signal ODTWEN.

The latency tuning block 109 may include a first shifter 1100, a second shifter 1200, and a third shifter 1300.

The first shifter 1100 may be configured to shift the timing-tuned read command RDCMDB, based on the timing-tuned delay-locked clock signal DLLCLKD, according to the latency control signal CTRL_LTC, and output the data output enable signal LTCB.

The second shifter 1200 may be configured to shift the timing-tuned on-die termination command ODTCMDB, based on the timing-tuned delay-locked clock signal DLLCLKD, according to the latency control signal CTRL_LTC, and output the on-die termination enable signal ODTWEN.

The third shifter 1300 may be configured to shift the timing-tuned dynamic on-die termination command DODTCMDB, based on the timing-tuned delay-locked clock signal DLLCLKD, according to the latency control signal CTRL_LTC, and output the on-die termination enable signal ODTWEN.

Hereinbelow, the timing margin self-tuning operation of the semiconductor apparatus 100 in accordance with the embodiments will be described with reference to FIGS. 14a to 15d.

Figure 14A:
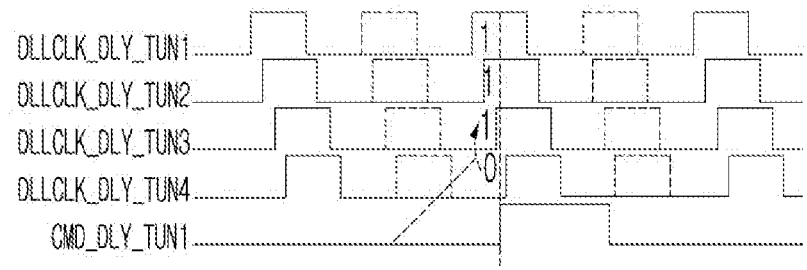
FIGS. 14A to 14D are representations of examples of diagrams to assist in the explanation of the operations of the semiconductor apparatus in accordance with the embodiments in the examples where a command timing is later than a delay-locked clock signal.
Figure 14B:
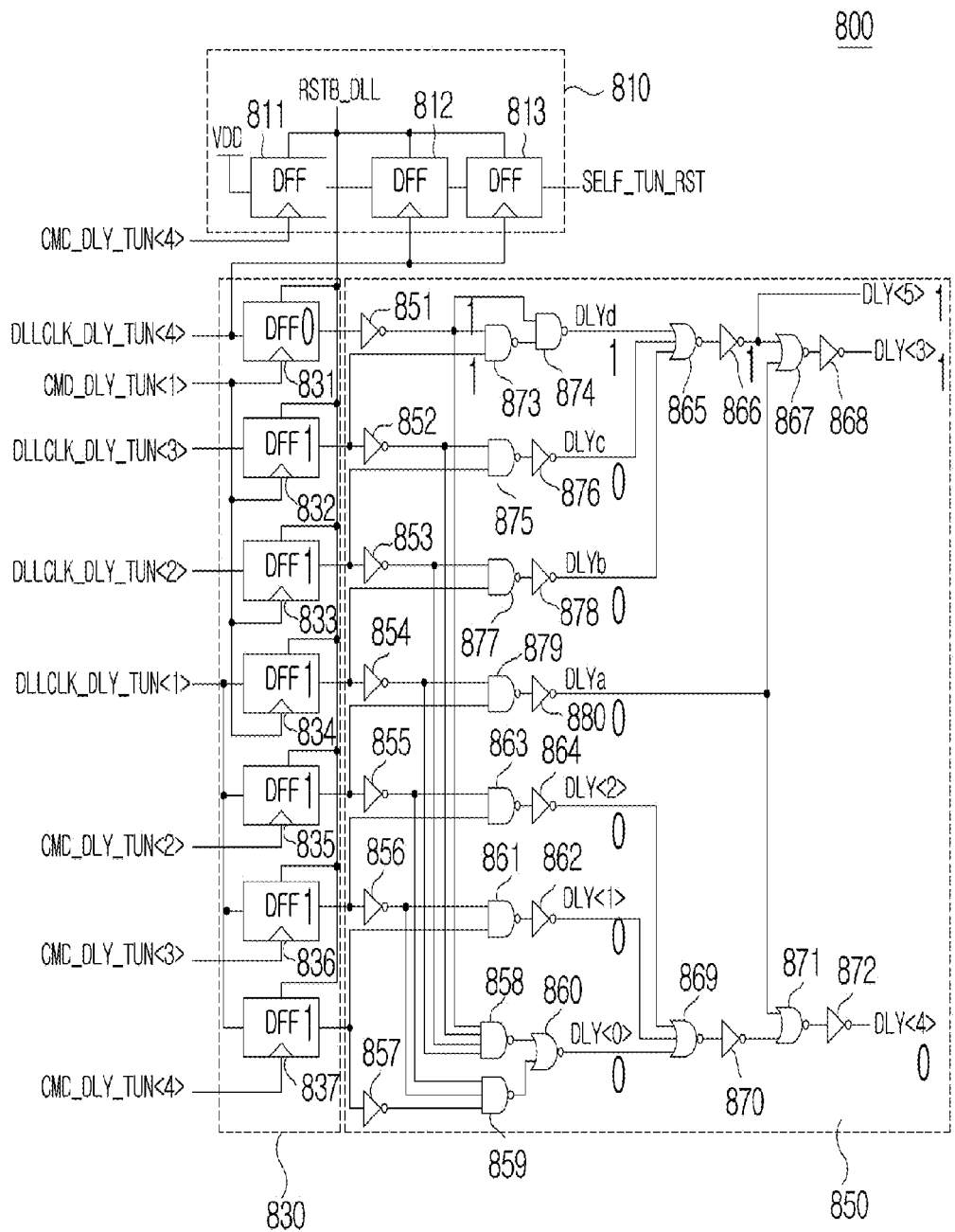

First, in the examples where the rising edge of the delay-locked internal command ICMD is later than the delay-locked clock signal DLLCLK as in FIG. 14a, the comparing section 830 outputs the plurality of phase difference signals as '0111111' as in FIG. 14b.

The delay control signal generating section 850 outputs the delay control signals DLY<0:5> as '000101'.

Figure 14C:
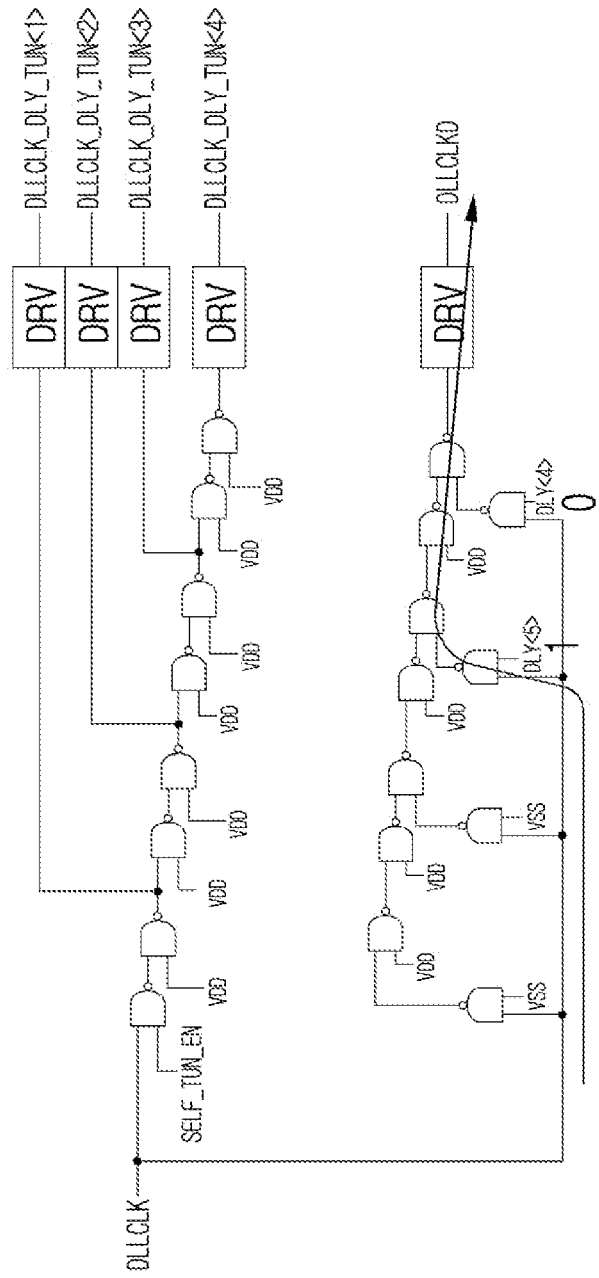

As in FIG. 14c, the clock timing tuning unit 700 delays the delay-locked clock signal DLLCLK through unit delays of two stages according to the delay control signals DLY<4:5> among the delay control signals DLY<0:5>, and generates the timing-tuned delay-locked clock signal DLLCLKD.

Figure 14D:
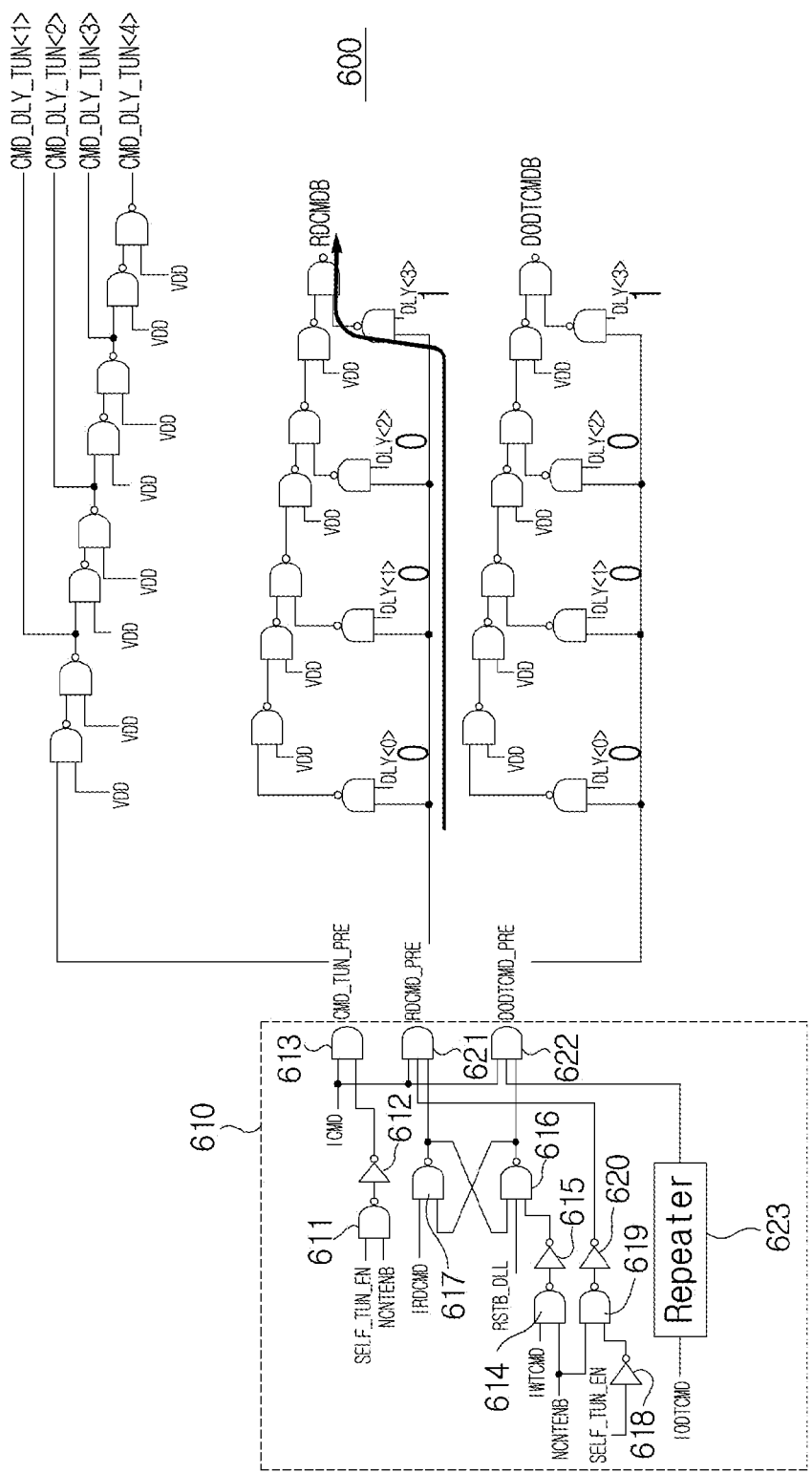

When assuming that the internal read command IRDCMD is generated according to a read operation, as in FIG. 14d, the command timing tuning unit 600 delays the pre-read command RDCMD_PRE through the unit delay of one stage according to the delay control signals DLY<0:3> among the delay control signals DLY<0:5>, and outputs the timing-tuned read command RDCMDB.

Figure 15A:
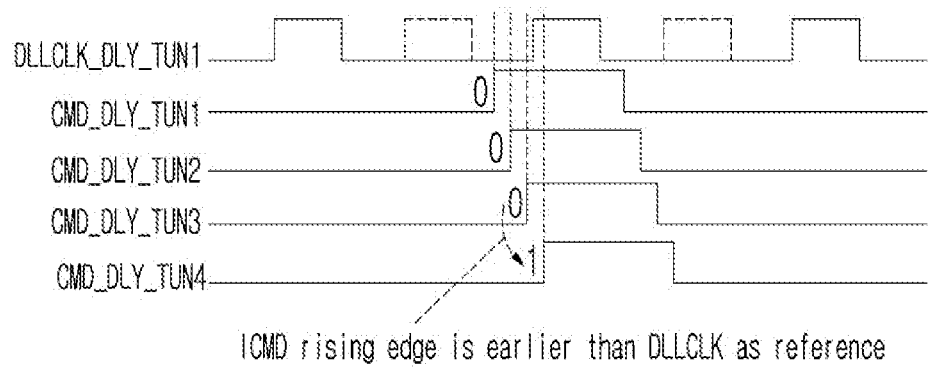
FIGS. 15A to 15D are representations of examples of diagrams to assist in the explanation of the operations of the semiconductor apparatus in accordance with the embodiments in the examples where a command timing is earlier than the delay-locked clock signal.
Figure 15B:
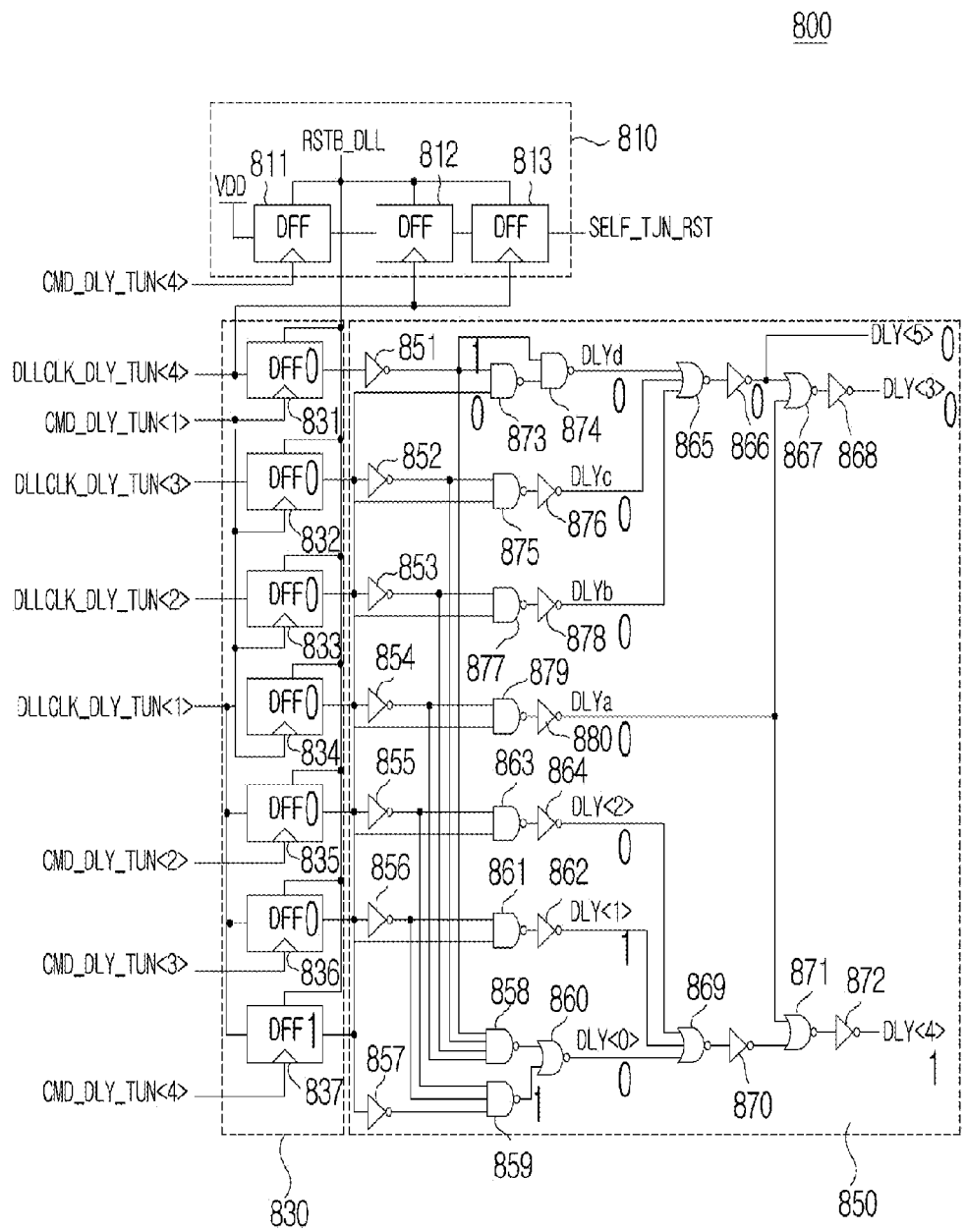

Next, in the examples where the rising edge of the delay-locked internal command ICMD is earlier than the delay-locked clock signal DLLCLK as in FIG. 15a, the comparing section 830 outputs the plurality of phase difference signals as '0000001' as in FIG. 15b.

The delay control signal generating section 850 outputs the delay control signals DLY<0:5> as '010010'.

Figure 15C:
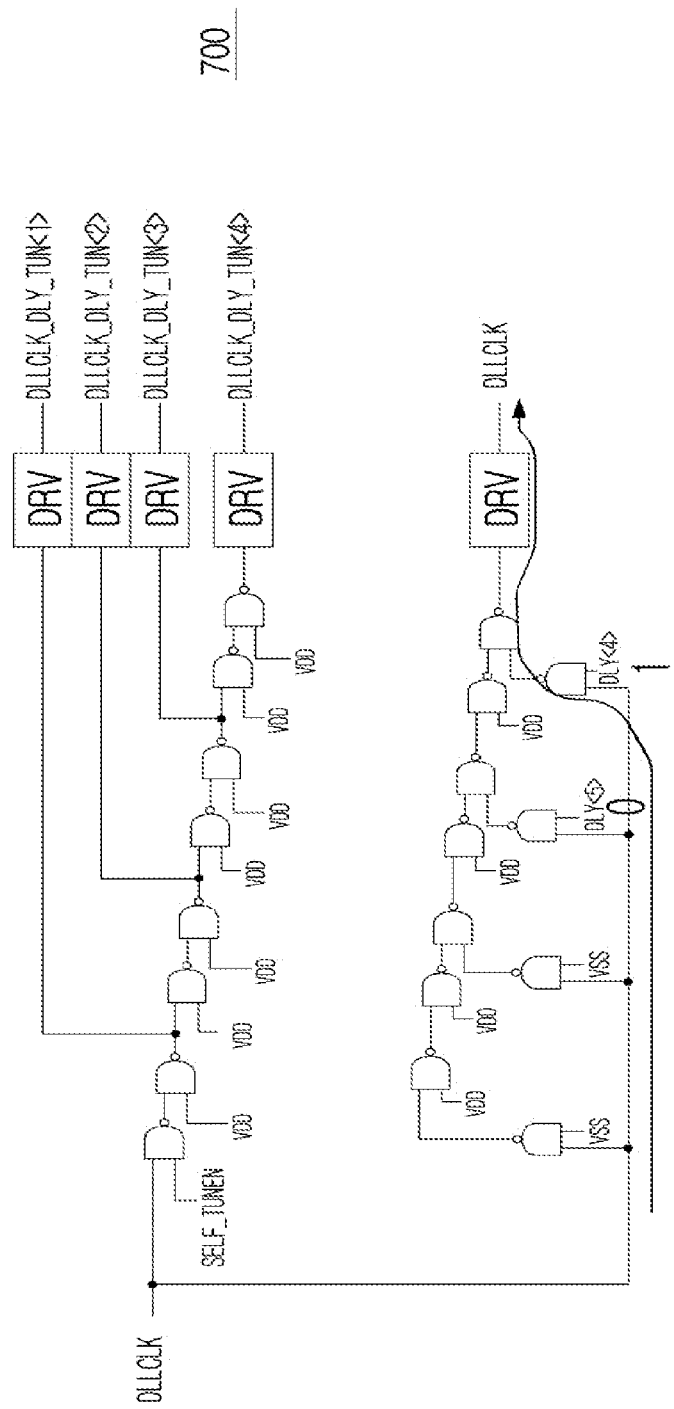

Referring to FIG. 15c, the clock timing tuning unit 700 delays the delay-locked clock signal DLLCLK through the unit delay of one stage according to the delay control signals DLY<4:5> among the delay control signals DLY<0:5>, and generates the timing-tuned delay-locked clock signal DLLCLKD.

Figure 15D:
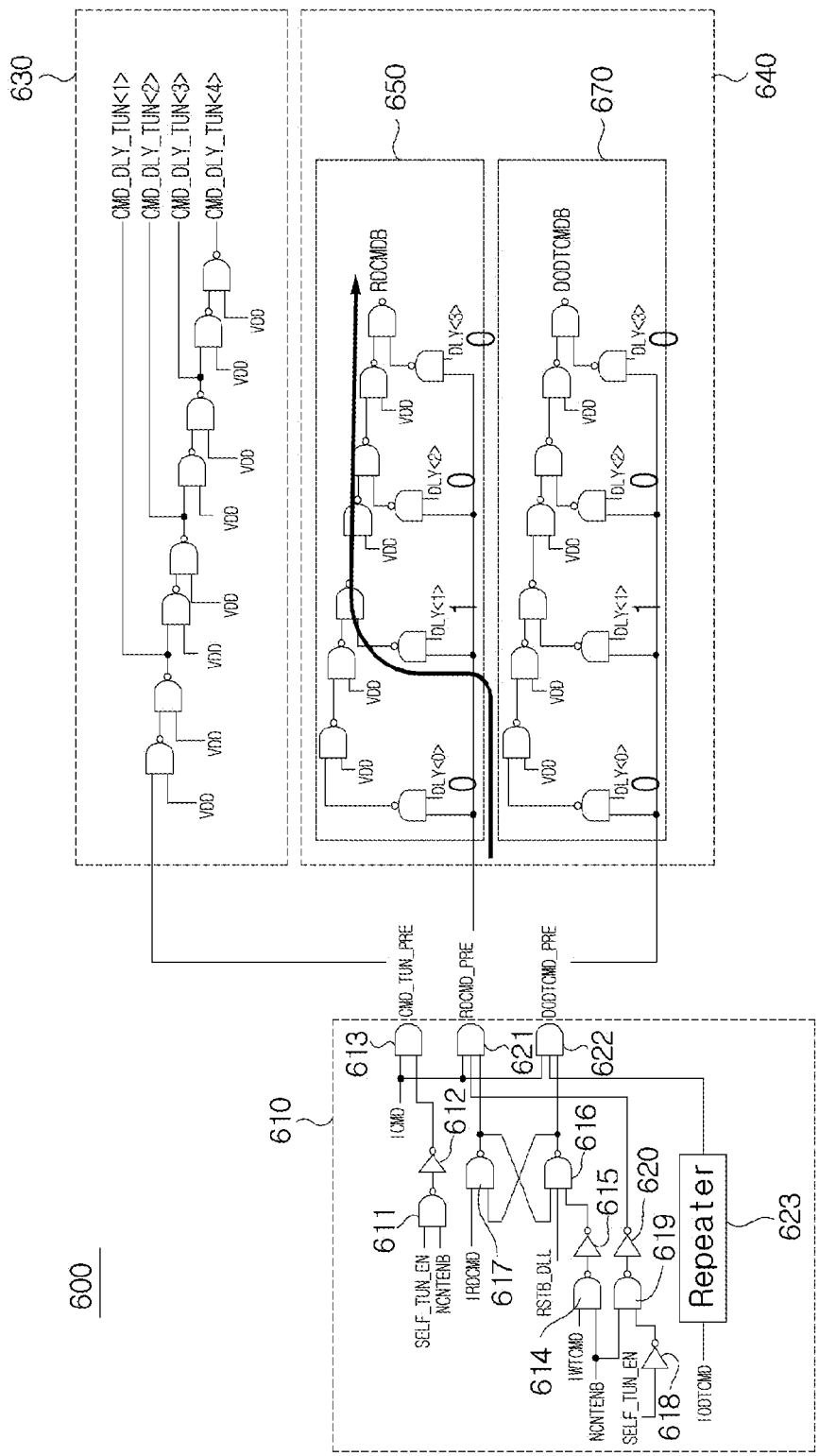

When assuming that the internal read command IRDCMD is generated according to a read operation, as in FIG. 15d, the command timing tuning unit 600 delays the pre-read command RDCMD_PRE through the unit delay of three stages according to the delay control signals DLY<0:3> among the delay control signals DLY<0:5>, and outputs the timing-tuned read command RDCMDB.

In the embodiments, the timing margin error between an external command and a delay-locked loop clock signal may be compensated for by the above-described self-tuning operation.

In the embodiments illustrated in FIG. 1, an internal read command is generated using a virtual command, and the timings of a read command, a delay-locked clock signal (DLLCLK), an on-die termination command and a write command are tuned based on the internal read command.

Figure 16:
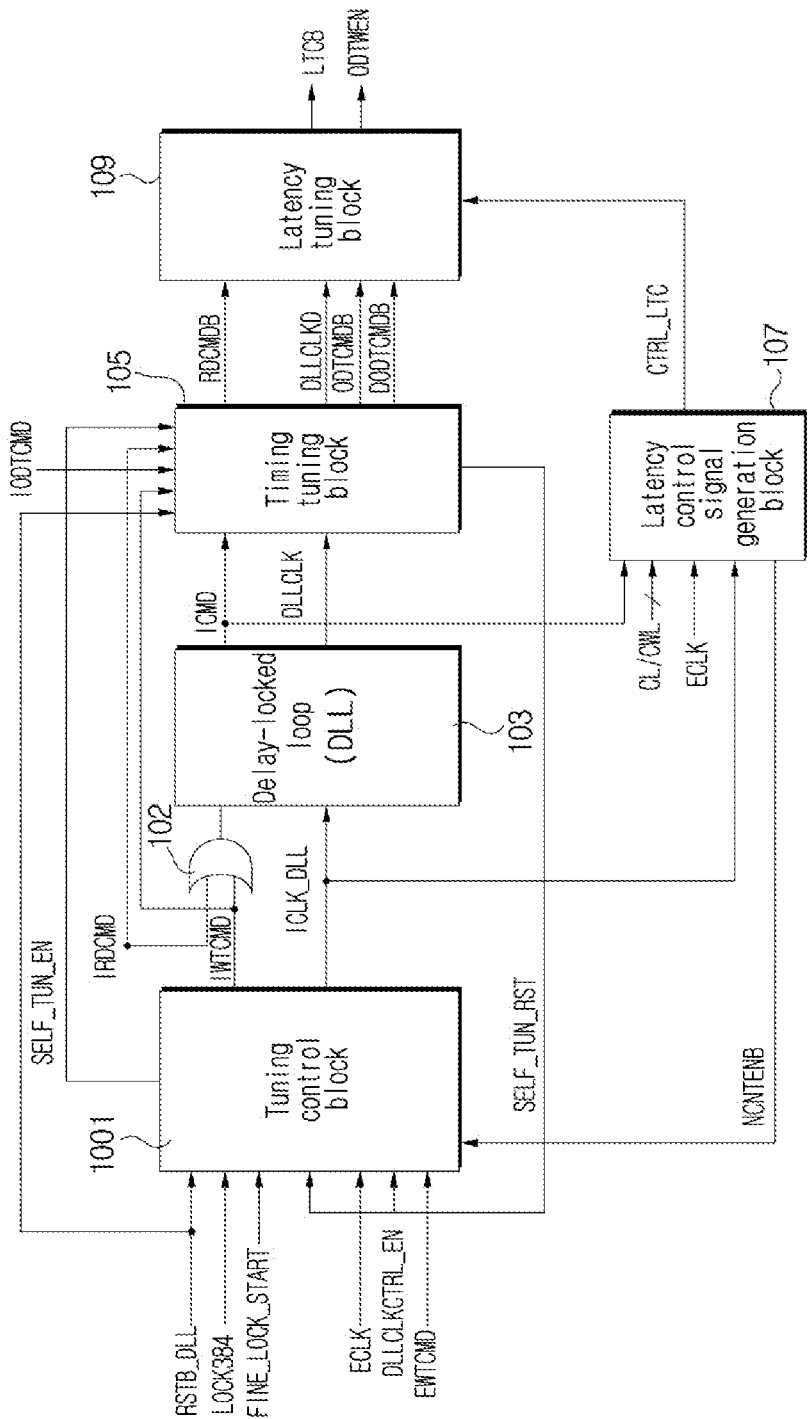
FIG. 16 is a block diagram illustrating a representation of an example of a semiconductor apparatus in accordance with an embodiment.

An embodiment according to FIG. 16 is different from the embodiments according to FIG. 1 in that an internal write command is generated using a virtual command.

In the embodiments according to FIG. 16, the phase difference between an internal write command, which is delay-locked through a delay-locked loop, and a delay-locked clock signal, which is outputted from the delay-locked loop, is detected, and the timings of a read command, the delay-locked clock signal (DLLCLK), an on-die termination command and a write command are tuned in conformity with the detected phase difference.

As illustrated in FIG. 16, a semiconductor apparatus 1000 in accordance with an embodiment may include a tuning control block 1001, a delay-locked loop (DLL) 103, and a timing tuning block 105.

The semiconductor apparatus 1000 in accordance with the embodiments may further include a logic gate 102, a latency control signal generation block 107, and a latency tuning block 109.

Since the delay-locked loop 103, the timing tuning block 105, the logic gate 102, the latency control signal generation block 107 and the latency tuning block 109 may be configured in the same way or substantially the same way as in the semiconductor apparatus 100 in accordance with the embodiments illustrated in FIG. 1, descriptions thereof will be omitted.

The tuning control block 1001 may be configured to generate an internal write command IWTCMD in response to a self-tuning enable signal SELF_TUN_EN generated by determining the delay locking completion time of the delay-locked loop 103, and generate a first internal clock signal ICLK_DLL using an external clock signal ECLK.

Figure 17:
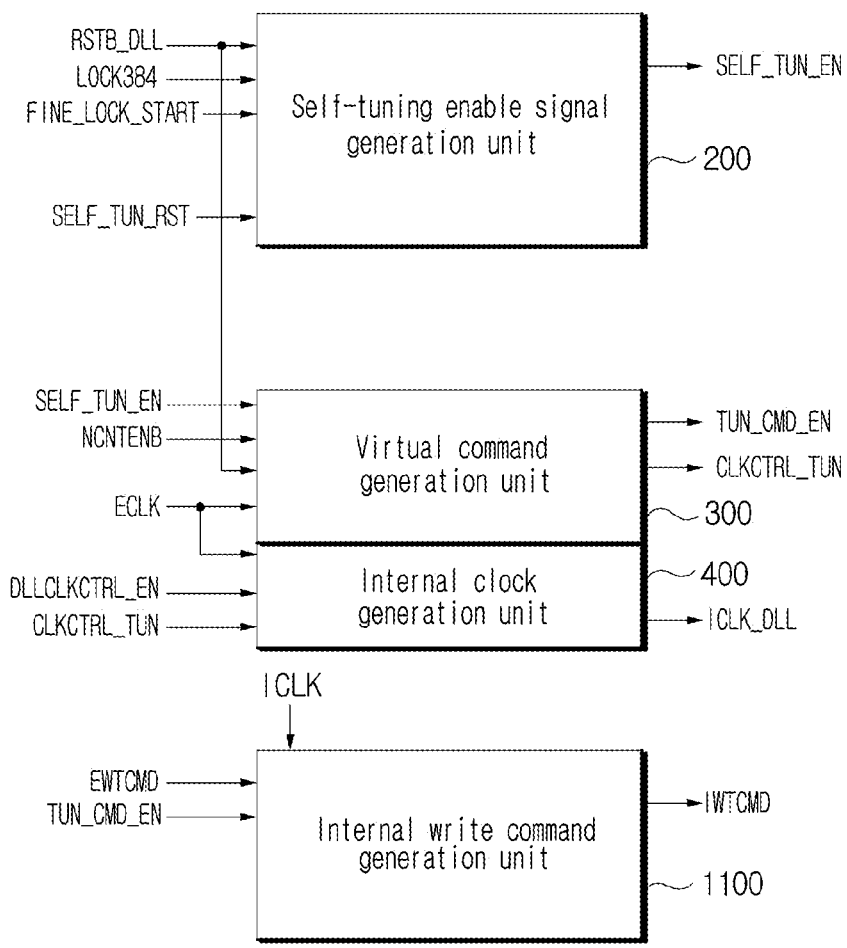
FIG. 17 is a block diagram illustrating a representation of an example of the tuning control block illustrated in FIG. 16.

As illustrated in FIG. 17, the tuning control block 1001 may include a self-tuning enable signal generation unit 200, a virtual command generation unit 300, an internal clock generation unit 400, and an internal write command generation unit 500.

Since the self-tuning enable signal generation unit 200, the virtual command generation unit 300 and the internal clock generation unit 400 may be configured in the same way or substantially the same way as in the semiconductor apparatus 100 in accordance with the embodiments illustrated in FIG. 2, descriptions thereof will be omitted.

The internal write command generation unit 1100 may be configured to generate the internal write command IWTCMD in response to an external write command EWTCMD or a virtual command TUN_CMD_EN.

Figure 18:
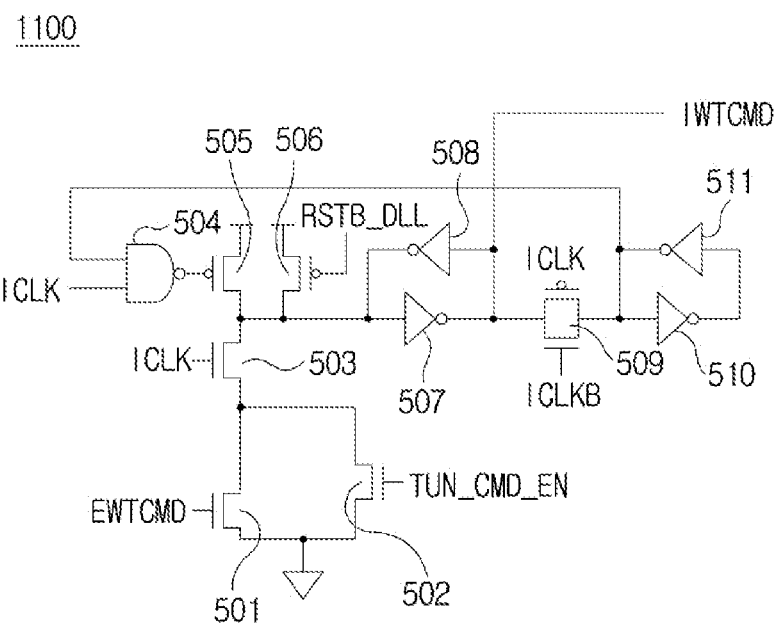
FIG. 18 is a circuit diagram illustrating a representation of an example of the internal write command generation unit illustrated in FIG. 17.

As illustrated in FIG. 18, the internal write command generation unit 1100 may include a plurality of logic gates 501 to 511.

The logic gates 501 to 503, 507 and 508 transition the internal write command IWTCMD to a logic high according to a second internal clock signal ICLK when the virtual command TUN_CMD_EN is inputted.

The logic gates 501 to 503, 507 and 508 transition the internal write command IWTCMD to the logic high according to the second internal clock signal ICLK even in the examples where the external write command EWTCMD is inputted.

The logic gates 504, 505 and 509 to 511 transition the internal write command IWTCMD to a logic low according to the internal write command IWTCMD and the second internal clock signal ICLK, such that the internal write command IWTCMD has a predetermined pulse width.

In other words, the logic gates 509 to 511 latch the output of the logic gate 507 in response to the falling edge of the second internal clock signal ICLK. The logic gate 504 NANDs or performs a NAND logic function on the second internal clock signal ICLK and the output of the logic gate 511, and outputs an output. The logic gate 505 transitions the internal write command IWTCMD to the logic low according to the output of the logic gate 504.

The logic gate 506 resets the internal write command IWTCMD according to the delay-locked loop reset signal RSTB_DLL.

Figure 19:
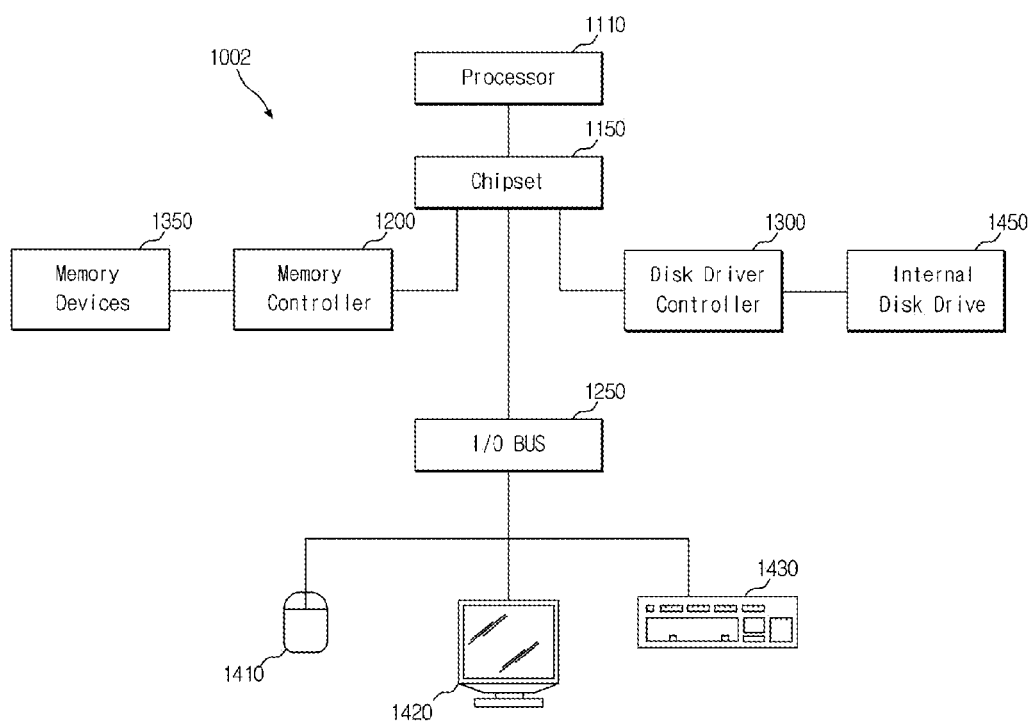
FIG. 19 illustrates a block diagram of an example of a representation of a system employing the semiconductor apparatus in accordance with the embodiments discussed above with relation to FIGS. 1-18.

The semiconductor apparatuses discussed above (see FIGS. 1-18) are particular useful in the design of memory devices, processors, and computer systems. For example, referring to FIG. 19, a block diagram of a system employing the semiconductor apparatus in accordance with the embodiments are illustrated and generally designated by a reference numeral 1002. The system 1002 may include one or more processors or central processing units ("CPUs") 1100. The CPU 1110 may be used individually or in combination with other CPUs. While the CPU 1110 will be referred to primarily in the singular, it will be understood by those skilled in the art that a system with any number of physical or logical CPUs may be implemented.

A chipset 1150 may be operably coupled to the CPU 1110. The chipset 1150 is a communication pathway for signals between the CPU 1110 and other components of the system 1002, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1002 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-18. Thus, the memory controller 1200 can receive a request provided from the CPU 1110, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-18, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1002 described above in relation to FIG. 19 is merely one example of a system employing the semiconductor apparatus as discussed above with relation to FIGS. 1-18. In alternate embodiments, such as cellular phones or digital cameras, the components may differ from the embodiments illustrated in FIG. 19.

While various embodiments have been described above, it will be understood to those skilled in the art that the embodiments described are by way of example only. Accordingly, the semiconductor apparatus having the capability of self-tuning a timing margin described herein should not be limited based on the described embodiments.

What is claimed is:

1. A semiconductor apparatus comprising:
a delay-locked loop configured to generate a delay-locked clock signal through a delay locking operation of an internal clock signal and an external clock signal, and delay an internal read command by a delay time tuned in the delay locking operation and generate a delay-locked internal command;
a tuning control block configured to generate the internal read command in response to a self-tuning enable signal generated by determining a delay locking completion time of the delay-locked loop; and
a timing tuning block configured to generate delay control signals according to a phase difference of the delay-locked clock signal and the delay-locked internal command, and tune a delay time of the internal read command according to the delay control signals and generate a timing-tuned read command.

2. The semiconductor apparatus according to claim 1, wherein the tuning control block is configured to generate the internal clock signal by using the external clock signal.

3. The semiconductor apparatus according to claim 2, wherein the tuning control block comprises:
a self-tuning enable signal generation unit configured to enable the self-tuning enable signal when the delay locking completion time is within a predetermined time;
a virtual command generation unit configured to generate a virtual command and a clock mask signal in response to the self-tuning enable signal and the external clock signal;
an internal clock generation unit configured to generate the internal clock signal in response to the external clock signal and the clock mask signal; and
an internal read command generation unit configured to generate the internal read command in response to an external read command or the virtual command.

4. The semiconductor apparatus according to claim 3, wherein the virtual command generation unit comprises:
a source signal generating section configured to generate a source signal in response to enablement of the self-tuning enable signal; and
a synchronizing delay section configured to delay the source signal to be synchronized with the external clock signal, and generate the virtual command and the clock mask signal.

5. The semiconductor apparatus according to claim 3, wherein the internal clock generation unit is configured to output remaining clock pulses excluding clock pulses masked by the clock mask signal among clock pulses of the external clock signal, as the internal clock signal.

6. The semiconductor apparatus according to claim 1, wherein the timing tuning block is configured to tune a delay time of the delay-locked clock signal according to the delay control signals, and generate a timing-tuned delay-locked clock signal.

7. The semiconductor apparatus according to claim 6, wherein the timing tuning block comprises:
a command timing tuning unit configured to tune the delay time of the internal read command according to the delay control signals and generate the timing-tuned read command, and pass the delay-locked internal command through a delay path formed by replicating a delay path of the timing-tuned read command, according to the self-tuning enable signal, and output command path replica signals;
a clock timing tuning unit configured to tune the delay time of the delay-locked clock signal according to the delay control signals and output the timing-tuned delay-locked clock signal, and pass the delay-locked clock signal through a delay path formed by replicating a delay path of the timing-tuned delay-locked clock signal, according to the self-tuning enable signal, and output delay-locked clock path replica signals; and
a detection unit configured to detect phase differences between the command path replica signals and the delay-locked clock path replica signals, and generate the delay control signals according to the detected phase differences.

8. The semiconductor apparatus according to claim 7, wherein the command timing tuning unit comprises:
- a pre-signal generating section configured to generate a pre-read command in response to the internal read command, and generate a pre-tuning command in response to the self-tuning enable signal and the delay-locked internal command;
- a command delay section configured to delay the pre-read command according to the delay control signals, and output the timing-tuned read command; and
- a command path replicating section configured by replicating command delay section, and configured to sequentially delay the pre-tuning command and output the command path replica signals.

9. The semiconductor apparatus according to claim 7, wherein the clock timing tuning unit comprises:
- a delay-locked clock delay section configured to delay the delay-locked clock signal according to the delay control signals, and output the timing-tuned delay-locked clock signal; and
- a delay-locked clock path replicating section configured by replicating the delay-locked clock delay section, and configured to sequentially delay the delay-locked clock signal according to the self-tuning enable signal and output the delay-locked clock path replica signals.

10. The semiconductor apparatus according to claim 7, wherein the detection unit comprises:
- a comparing section configured to compare phases of the command path replica signals and the delay-locked clock path replica signals, and detect a plurality of phase difference signals; and
- a delay control signal generating section configured to combine the plurality of phase difference signals, and output the delay control signals.

11. The semiconductor apparatus according to claim 1, further comprising:
- a latency control signal generation block configured to generate a latency control signal in response to the external clock signal, the delay-locked internal command and preset latencies; and
- a latency tuning block configured to tune a latency of the timing-tuned read command according to the latency control signal, and output a data output enable signal.

12. A semiconductor apparatus comprising:
- a delay-locked loop configured to generate a delay-locked clock signal through a delay locking operation of an internal clock signal and an external clock signal, and delay an internal read command or an internal write command by a delay time tuned in the delay locking operation and generate a delay-locked internal command;
- a tuning control block configured to generate the internal read command in response to a self-tuning enable signal generated by determining a delay locking completion time of the delay-locked loop; and
- a timing tuning block configured to generate delay control signals according to a phase difference of the delay-locked clock signal and the delay-locked internal command, and tune a delay time of the internal read command or an on-die termination command according to the delay control signals and generate a timing-tuned read command or a timing-tuned on-die termination command.

13. The semiconductor apparatus according to claim 12, wherein the tuning control block is configured to generate the internal clock signal by using the external clock signal.

14. The semiconductor apparatus according to claim 13, wherein the tuning control block comprises:
- a self-tuning enable signal generation unit configured to enable the self-tuning enable signal when the delay locking completion time is within a predetermined time;
- a virtual command generation unit configured to generate a virtual command and a clock mask signal in response to the self-tuning enable signal and the external clock signal;
- an internal clock generation unit configured to generate the internal clock signal in response to the external clock signal and the clock mask signal; and
- an internal read command generation unit configured to generate the internal read command in response to an external read command or the virtual command.

15. The semiconductor apparatus according to claim 14, wherein the virtual command generation unit comprises:
- a source signal generating section configured to generate a source signal in response to enablement of the self-tuning enable signal; and
- a synchronizing delay section configured to delay the source signal to be synchronized with the external clock signal, and generate the virtual command and the clock mask signal.

16. The semiconductor apparatus according to claim 14, wherein the internal clock generation unit is configured to output remaining clock pulses excluding clock pulses masked by the clock mask signal among clock pulses of the external clock signal, as the internal clock signal.

17. The semiconductor apparatus according to claim 12, wherein the timing tuning block is configured to tune a delay time of the delay-locked clock signal according to the delay control signals, and generate a timing-tuned delay-locked clock signal.

18. The semiconductor apparatus according to claim 17, wherein the timing tuning block is configured to tune a delay time of the internal write command according to the delay control signals, and generate a timing-tuned dynamic on-die termination command.

19. The semiconductor apparatus according to claim 18, wherein the timing tuning block comprises:
- a command timing tuning unit configured to tune the delay time of the internal read command, the internal write command or the on-die termination command according to the delay control signals and generate the timing-tuned read command, the timing-tuned dynamic on-die termination command or the timing-tuned on-die termination command, and pass the delay-locked internal command through a delay path formed by replicating a delay path of the timing-tuned read command, in response to the self-tuning enable signal, and output command path replica signals;
- a clock timing tuning unit configured to tune the delay time of the delay-locked clock signal in response to the delay control signals and output the timing-tuned delay-locked clock signal, and pass the delay-locked clock signal through a delay path formed by replicating a delay path of the timing-tuned delay-locked clock signal, in response to the self-tuning enable signal, and output delay-locked clock path replica signals; and
- a detection unit configured to detect phase differences between the command path replica signals and the delay-locked clock path replica signals, and generate the delay control signals according to the detected phase differences.

20. The semiconductor apparatus according to claim 19, wherein the command timing tuning unit comprises:

a pre-signal generating section configured to generate a pre-read command, a pre-dynamic on-die termination command or a pre-on-die termination command in response to the internal read command, the internal write command or the on-die termination command, and generate a pre-tuning command in response to the self-tuning enable signal and the delay-locked internal command;

a command delay section configured to delay the pre-read command, the pre-dynamic on-die termination command or the pre-on-die termination command according to the delay control signals, and output the timing-tuned read command, the timing-tuned dynamic on-die termination command or the timing-tuned on-die termination command; and a command path replicating section configured by replicating command delay section, and configured to sequentially delay the pre-tuning command and output the command path replica signals.

21. The semiconductor apparatus according to claim 19, wherein the clock timing tuning unit comprises:

a delay-locked clock delay section configured to delay the delay-locked clock signal according to the delay control signals, and output the timing-tuned delay-locked clock signal; and a delay-locked clock path replicating section configured by replicating the delay-locked clock delay section, and configured to sequentially delay the delay-locked clock signal according to the self-tuning enable signal and output the delay-locked clock path replica signals.

22. The semiconductor apparatus according to claim 19, wherein the detection unit comprises:

a comparing section configured to compare phases of the command path replica signals and the delay-locked clock path replica signals, and detect a plurality of phase difference signals; and a delay control signal generating section configured to combine the plurality of phase difference signals, and output the delay control signals.

23. The semiconductor apparatus according to claim 12, further comprising:

a latency control signal generation block configured to generate a latency control signal in response to the external clock signal, the delay-locked internal command, a CAS latency and a CAS write latency; and a latency tuning block configured to tune a latency of the timing-tuned read command or the timing-tuned on-die termination command according to the latency control signal, and output a data output enable signal or an on-die termination enable signal.

24. The semiconductor apparatus according to claim 23, wherein the latency control signal generation block is configured to generate the latency control signal by using the CAS latency in the case where the delay-locked internal command is generated by the internal read command, and generate the latency control signal by using the CAS write latency in the case where the delay-locked internal command is generated by the internal write command.

25. A semiconductor apparatus comprising:

a delay-locked loop configured to generate a delay-locked clock signal through a delay locking operation of an internal clock signal and an external clock signal, and delay an internal write command by a delay time tuned in the delay locking operation and generate a delay-locked internal command;

a tuning control block configured to generate the internal write command in response to a self-tuning enable signal generated by determining a delay locking completion time of the delay-locked loop; and a timing tuning block configured to generate delay control signals according to a phase difference of the delay-locked clock signal and the delay-locked internal command, and tune a delay time of an internal read command according to the delay control signals and generate a timing-tuned read command.

26. The semiconductor apparatus according to claim 25, wherein the tuning control block is configured to generate the internal clock signal by using the external clock signal.

27. The semiconductor apparatus according to claim 26, wherein the tuning control block comprises:

a self-tuning enable signal generation unit configured to enable the self-tuning enable signal when the delay locking completion time is within a predetermined time;

a virtual command generation unit configured to generate a virtual command and a clock mask signal in response to the self-tuning enable signal and the external clock signal;

an internal clock generation unit configured to generate the internal clock signal in response to the external clock signal and the clock mask signal; and an internal write command generation unit configured to generate the internal write command in response to an external write command or the virtual command.

28. The semiconductor apparatus according to claim 25, wherein the timing tuning block is configured to tune a delay time of an on-die termination command according to the delay control signals, and generate a timing-tuned on-die termination command.

29. The semiconductor apparatus according to claim 25, wherein the timing tuning block is configured to tune a delay time of the internal write command according to the delay control signals, and generate a timing-tuned dynamic on-die termination command.

30. The semiconductor apparatus according to claim 28, further comprising:

a latency control signal generation block configured to generate a latency control signal in response to the external clock signal, the delay-locked internal command, a CAS latency and a CAS write latency; and a latency tuning block configured to tune a latency of the timing-tuned read command or the timing-tuned on-die termination command according to the latency control signal, and output a data output enable signal or an on-die termination enable signal.

* * * * *